United States Patent
Hwang et al.

(10) Patent No.: US 12,004,341 B2
(45) Date of Patent: Jun. 4, 2024

(54) RECESSED CHANNEL FIN INTEGRATION

(71) Applicant: Micron Technology, Inc., Boise, ID (US)

(72) Inventors: Sangmin Hwang, Boise, ID (US); Si-Woo Lee, Boise, ID (US)

(73) Assignee: Micron Technology, Inc., Boise, ID (US)

(*) Notice: Subject to any disclaimer, the term of this patent is extended or adjusted under 35 U.S.C. 154(b) by 12 days.

(21) Appl. No.: 17/886,917

(22) Filed: Aug. 12, 2022

(65) Prior Publication Data

US 2024/0057317 A1 Feb. 15, 2024

(51) Int. Cl.
H10B 12/00 (2023.01)

(52) U.S. Cl.
CPC .......... H10B 12/36 (2023.02); H10B 12/056 (2023.02); H10B 12/50 (2023.02)

(58) Field of Classification Search
CPC ...... H10B 12/36; H10B 12/056; H10B 12/50; H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 29/04–045; H01L 29/16–1608; H01L 29/18–185; H01L 29/22–2206; H01L 29/36–365
See application file for complete search history.

(56) References Cited

U.S. PATENT DOCUMENTS

| | | | |
|---|---|---|---|
| 8,138,543 B2 | 3/2012 | Cheng et al. | |
| 8,759,904 B2 | 6/2014 | Wahl et al. | |
| 2019/0035938 A1* | 1/2019 | Park | H01L 29/7827 |
| 2019/0165099 A1 | 5/2019 | Chen et al. | |
| 2023/0352566 A1 | 11/2023 | Liu | |

OTHER PUBLICATIONS

"Chinese Application Serial No. 202310991068, Notification to Make Rectification dated Sep. 11, 2023", w/o English Translation, 1 page.
Oh, Dongyean, et al., "Industry's First Recessed Gate Transistor Technology for Sense Amplifer Circuit in DRAM: Phenomena of Randomly Threshold Voltage High Flying and Subthreshold Swing Degradation", 2020 IEEE International Electron Devices Meeting (IEDM), (2020), 4 pgs.

* cited by examiner

*Primary Examiner* — Mohammad A Rahman
(74) *Attorney, Agent, or Firm* — Schwegman Lundberg & Woessner, P.A.

(57) ABSTRACT

A variety of applications can include apparatus having a recessed channel FinFET. The recessed channel FinFET can include one or more fin structures between the source region and the drain region, where the one or more fin structures are recessed from a top level of the source region and from a top level of the drain region. The recessed channel FinFET can include a gate recessed from the top level of a source region and a drain region, where the gate can be separated from tip regions of the fin structures by a gate dielectric defining a channel between the source region and the drain region. Recessed channel FinFETs can be structured in a periphery to an array of a memory device and can be fabricated in a process merged with forming access lines to the array.

20 Claims, 29 Drawing Sheets

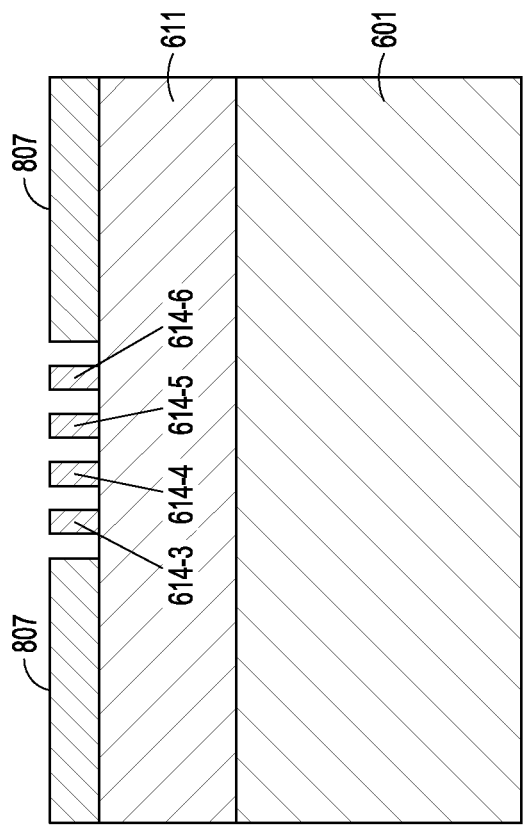
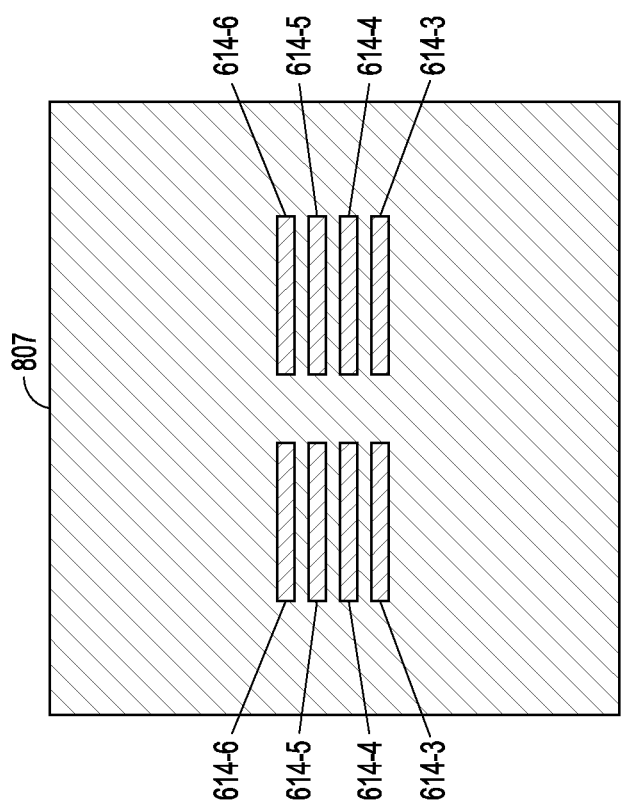
FIG. 8D
FIG. 8C

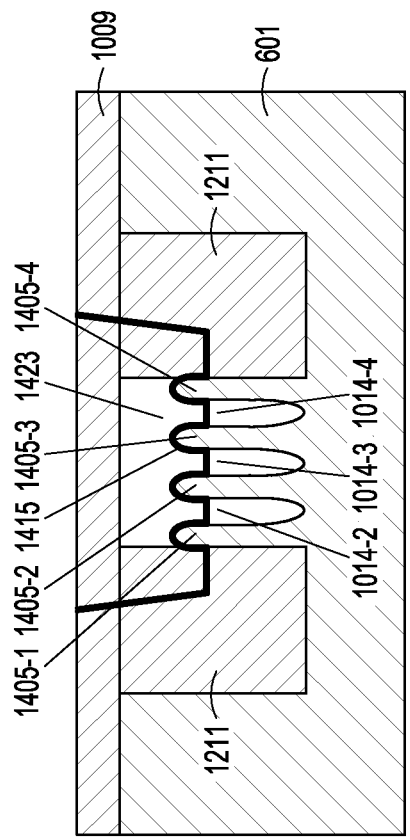
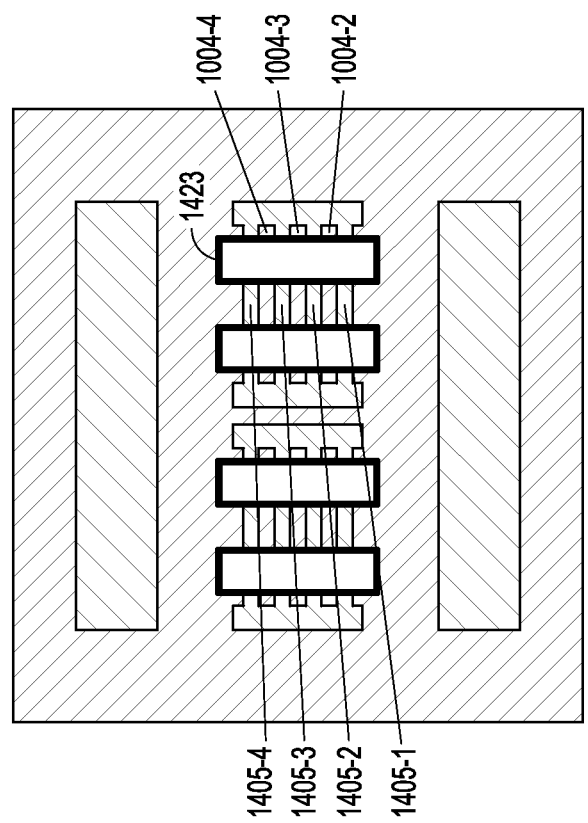
FIG. 15B
FIG. 15A

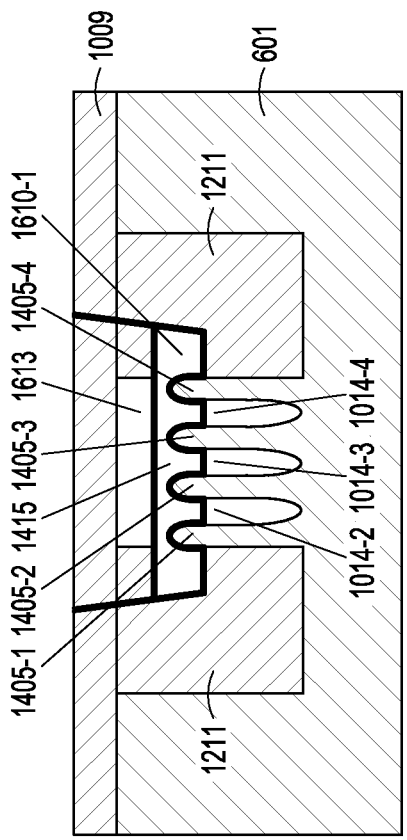
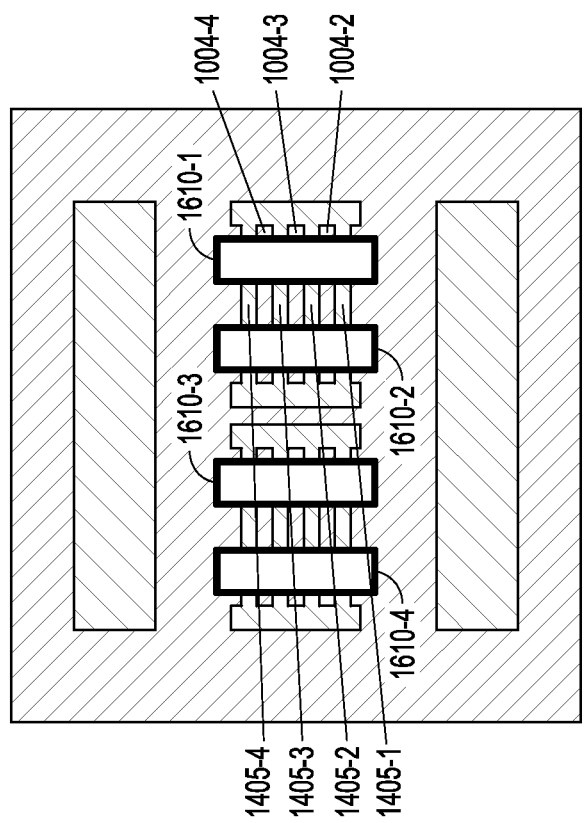
FIG. 16B
FIG. 16A

RECESSED CHANNEL FIN INTEGRATION

FIELD OF THE DISCLOSURE

Embodiments of the disclosure relate generally to electronic systems, and more specifically, to fin field-effect transistor devices and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. Properties of memory devices and other electronic devices can be improved by enhancements to the design and fabrication of components of the electronic devices such as fin field-effect transistors (FinFETs).

BRIEF DESCRIPTION OF THE DRAWINGS

The drawings, which are not necessarily drawn to scale, illustrate generally, by way of example, but not by way of limitation, various embodiments discussed in the present document.

FIGS. 6A-17D illustrate example process procedures of forming a recessed channel FinFET in the periphery to the array of a memory device in which forming components of the recessed channel FinFET are merged with forming components for the array, according to various embodiments.

DETAILED DESCRIPTION

Figure 1A:
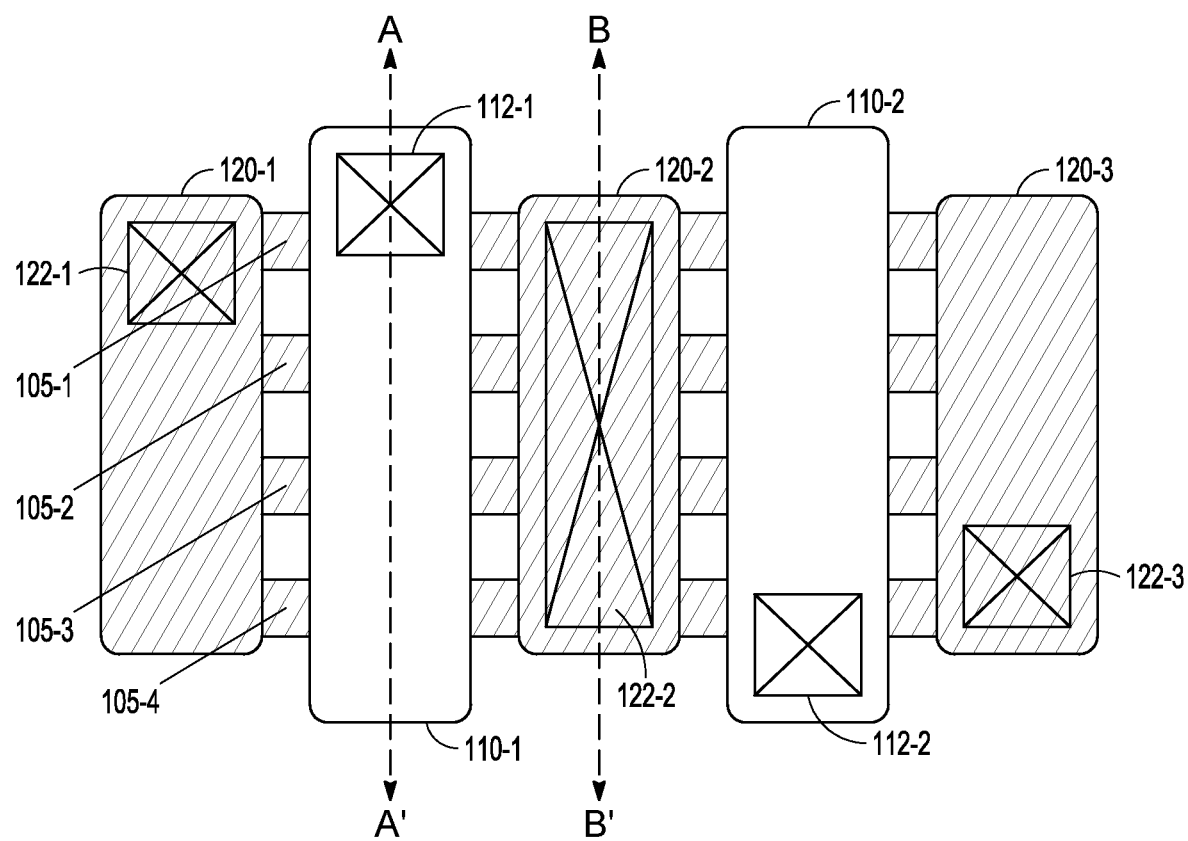
FIG. 1A is a top view of a representation of an example architecture of FinFETs for an integrated circuit, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

A number of techniques can be implemented to structure a recessed metal gate and recessed channel FinFET device for a sense amplifier or another circuit of a periphery area by combining the recess channel formation with processing of the memory array. The recessed metal gate can be, but is not limited to, TiN. Silicon active area formation can be conducted for both an array and one or more fins for a sense amplifier or periphery circuit. Recess channel area patterning can be performed by pitch double or pitch quad as performed for the memory array. Pitch can be taken to be the distance between repeated elements in a structure. Pitch double and pitch quad processes are multiple patterning techniques to manufacture integrated circuits (ICs) that are directed to enhance feature density in the semiconductor die. A pitch double process, for example, is a process in which the pitch frequency is doubled, that is, the pitch in a pattern is reduced by half. A pitch double process can make use of spacers to extend scanner limitation in resolution. For example, with an immersion processing limitation of approximately 38 nm, a spacer process can be used to define a 19 nm process without deep ultraviolet (DUV) processing.

Masks for array open processes to recess a memory array area in a DRAM process can be used to pattern a recess channel area for sense amplifier or periphery device. In other approaches, a channel recess etch process can be separated from memory array recessing. Techniques can include, after recess etch, forming a thin gate oxide for sense amplifier or other periphery device and a thick gate oxide for memory array device and periphery device. Techniques can include forming a n+ or p+ polysilicon gate for work function control. The work function corresponds to a minimum amount of energy needed to remove an electron from a solid to a point in a vacuum immediately outside the solid surface.

Such techniques for recessed channel FinFET device integration can provide for sense amplifier or periphery area scaling, due to smaller layout area of recessed channel FinFET device compared to planar devices. Process integration of recessed channel FinFET device is fully compatible with conventional recessed-access device (RAD) processing.

In various embodiments, a recessed channel FinFET structure and process can be integrated with memory array and memory array processing. Such recessed channel FinFET structure can be used in a sense amplifier or other device in the periphery area without significant process increases. In some approaches, an additional non-critical mask step can be used to form thin or thick gate oxide for the recess channel FinFET devices.

FIG. 1A is a top view of a representation of an embodiment of an example architecture 100 of FinFETs for an integrated circuit. Architecture 100 can include gates 110-1 and 110-2 and source/drain regions 120-1, 120-2, and 120-3. A metal contact 112-1 is connected to gate 110-1. A metal contact 112-2 is connected to gate 110-2. Metal contacts 122-1, 122-2, and 122-3 are connected to source/drain regions 120-1, 120-2, and 120-3, respectively. Fin structures 105-1, 105-2, 105-3, and 105-4 can be connected to and between source/drain regions 120-1 and 120-2. Though four gate structures are shown, architecture 100 or similar architectures can have more or less than four fin structures. Gate 110-1 can be situated such that gate 110-1 extends vertically above fin structures 105-1, 105-2, 105-3, and 105-4. Similar fin structures can be connected to and between source/drain regions 120-2 and 120-3, with gate 110-2 situated such that gate 110-2 extends vertically above the fin structures between source/drain regions 120-2 and 120-3.

Figure 1B:
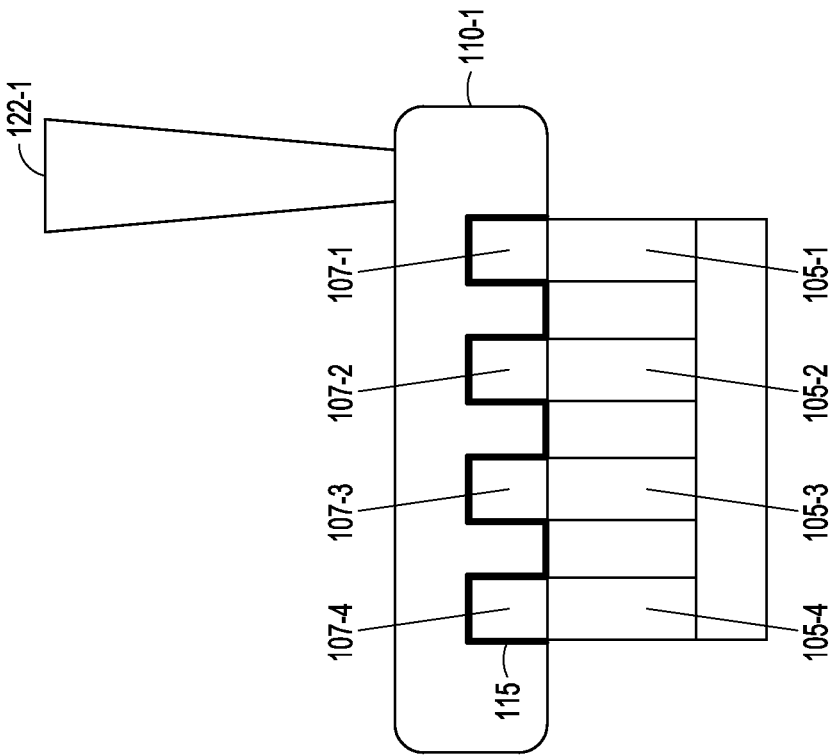
FIG. 1B is a cross-sectional view of a representation of the architecture shown in FIG. 1A along direction line A-A', according to various embodiments.

FIG. 1B is a cross-sectional view of a representation of an embodiment of architecture 100 along direction line A-A' shown in FIG. 1A. Metal contact 122-1 is a vertical contact to gate 110-1. Fin structures 105-1, 105-2, 105-3, and 105-4 extend vertically to a level corresponding to an interior of gate 110-1. Fin structures 105-1, 105-2, 105-3, and 105-4 have tip regions 107-1, 107-2, 107-3, and 107-4, respectively, which are vertical ends of fin structures 105-1, 105-2, 105-3, and 105-4. Though tip regions 107-1, 107-2, 107-3, and 107-4 are shown having a shape of a rectangular cuboid, tip regions 107-1, 107-2, 107-3, and 107-4 can have other shapes such as, but not limited to, dome-like shapes. Tip regions 107-1, 107-2, 107-3, and 107-4 are separated by dielectric 115 from gate 110-1. Dielectric 115 is a gate dielectric that defines a channel between source/drain region 120-2 and source/drain region 120-3.

Figure 1C:
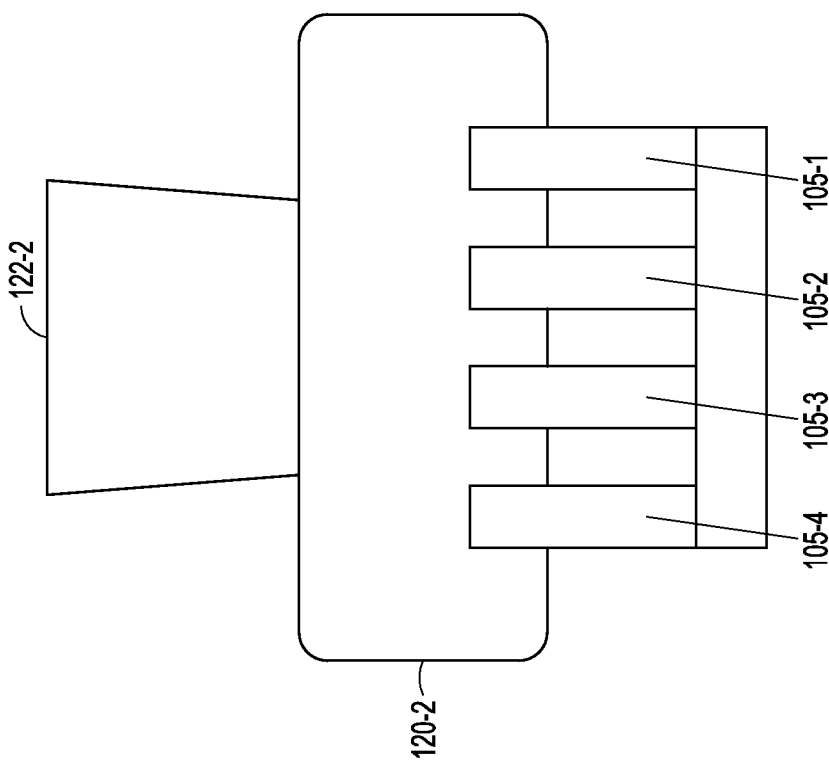
FIG. 1C is a cross-sectional view of a representation of the architecture shown in FIG. 1A along direction line B-B', according to various embodiments.

FIG. 1C is a cross-sectional view of a representation of an embodiment of architecture 100 along direction line B-B' shown in FIG. 1A. Metal contact 122-2 is a vertical contact to source/drain region 120-2. Metal contact 122-2 can be a local interconnect in a periphery to a memory array of a memory device. Fin structures 105-1, 105-2, 105-3, and 105-4 can be recessed from a top level of source/drain region 120-2. Fin structures 105-1, 105-2, 105-3, and 105-4 can also be recessed from a top level of source/drain region 120-2 of FIG. 1A.

Figure 2A:
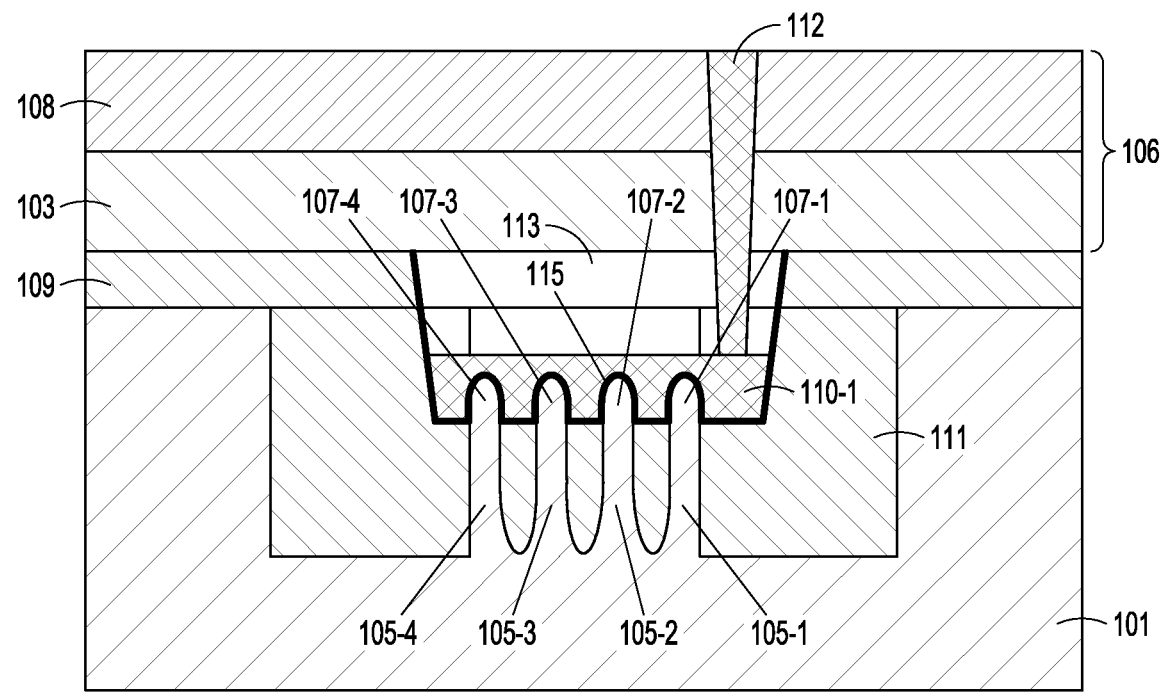
FIG. 2A is a cross-sectional view of a representation of example components of a FinFET for an integrated circuit along direction line A-A' shown in FIG. 1A, according to various embodiments.

FIG. 2A is a cross-sectional view of a representation of an embodiment of components of a FinFET for an integrated circuit along direction line A-A' shown in FIG. 1A. The components can include gate 110-1 connected to metal contact 112-1, where metal contact 112-1 can extend vertically through an inter-layer dielectric (ILD) 106. Gate 110-1 can be realized using one or more metallic compositions, such as but not limited to, titanium nitride (TiN), tantalum nitride (TaN), tungsten (W), molybdenum (Mo), Ruthenium (Ru), polysilicon (poly-Si), or combination of these conductive materials. Inter-layer dielectric 106 can include, but is not limited to an oxide region 103 and a nitride region 108. For example, oxide region 103 can be a silicon oxide ($SiO_X$) region and nitride region 108 can be a silicon nitride ($SiN_Y$) region.

Fin structures 105-1, 105-2, 105-3, and 105-4 can be structured in a recessed arrangement with gate 110-1 relative to source/drain regions of the FinFET. Fin structures 105-1, 105-2, 105-3, and 105-4 can have tip regions 107-1, 107-2, 107-3, and 107-4, respectively, which are vertical ends of fin structures 105-1, 105-2, 105-3, and 105-4. Though tip regions 107-1, 107-2, 107-3, and 107-4 are shown having dome-like shapes, tip regions 107-1, 107-2, 107-3, and 107-4 can have other shapes such as, but not limited to, rectangular cuboid shapes. Though four gate structures are shown in the structure of FIG. 2A, such structure or similar structures can have more or less than four fin structures. Gate 110-1 can be situated such that gate 110-1 extends vertically above fin structures 105-1, 105-2, 105-3, and 105-4 and recessed below an oxide 109 by a dielectric 113, where oxide 109 can be an upper capping dielectric to source/drain regions of the FinFET. Alternatively, a dielectric other than an oxide can be used for oxide 109. Dielectric 113 can be a dielectric nitride region. In some embodiments, fin structures 105-1, 105-2, 105-3, and 105-4 extend vertically from a level in region 101, which level can correspond to a bottom level of a shallow trench isolation (STI) 111. STI 111 can be an oxide such as but not limited to, silicon oxide.

Figure 2B:
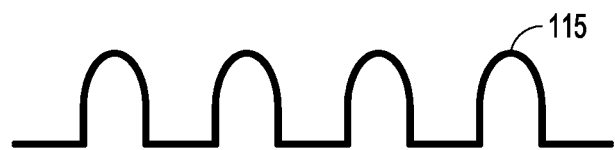
FIG. 2B is an illustration of a dielectric structured as a gate dielectric in the structure of FIG. 2A, according to various embodiments.

Tip regions 107-1, 107-2, 107-3, and 107-4 of fin structures 105-1, 105-2, 105-3, and 105-4, respectively are separated by dielectric 115 from gate 110-1. Dielectric 115 is a gate dielectric that defines a channel between the source/drain regions of FinFET. The distance from the top of each of tip regions 107-1, 107-2, 107-3, and 107-4 to a bottom level of gate 110-1 can range from about 0 Å to about 500 Å. Other distances can be implemented. FIG. 2B is an illustration of dielectric 115 as a gate dielectric, where the shape of the gate dielectric provides an elongated channel structure.

Figure 3:
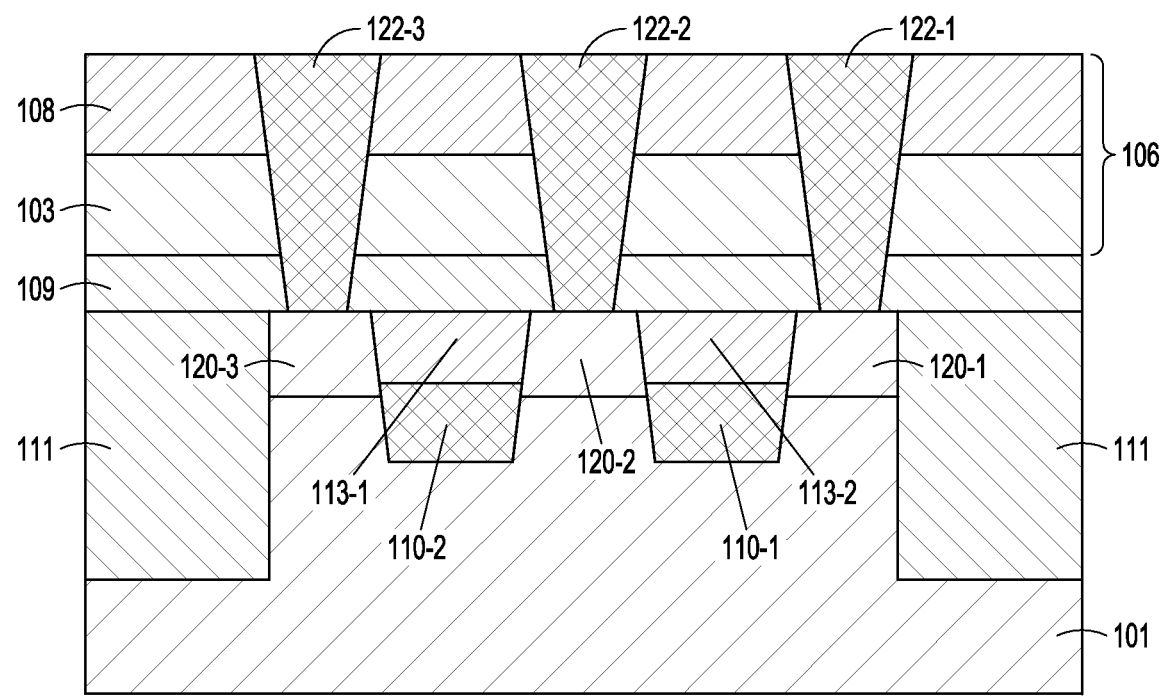
FIG. 3 is a cross-sectional view of a representation of architecture of FinFETs for an integrated circuit along a direction between fins and perpendicular to direction line A-A' shown in FIG. 1A, according to various embodiments.

FIG. 3 is a cross-sectional view of a representation of architecture 100 of FinFETs for an integrated circuit along a direction between fins and perpendicular to direction line A-A' shown in FIG. 1A. FIG. 3 shows two transistors sharing a common source/drain region 120-2. One transistor includes source/drain region 120-1 and the other transistor includes source/drain region 120-3. Oxide 109 can be arranged as a top level to source/drain regions 120-1, 120-2, and 120-3, where gates 110-1 and 110-2 are buried gates with respect to source/drain regions 120-1, 120-2, and 120-3. Bottoms of gates 110-1 and 110-2 can be located below source/drain regions 120-1, 120-2, and 120-3 to a level that can range to about 1400 Å. The bottom of gates 110-1 and 110-2 can be at distances greater than or less than 1400 Å. Source/drain regions 120-1, 120-2, and 120-3 are located on top of region 101, which can be a silicon region. Source/drain regions 120-1, 120-2, and 120-3 can extend from a bottom of oxide 109 to a junction of the respective source/drain region that is in a range from above 0 Å to about 700 Å. Junctions of source/drain regions 120-1, 120-2, and 120-3 can be overlapped or underlapped to gates 110-1 and 110-2. The buried gates of FIG. 3 and the gate dielectric on tip regions of fin structures of FIG. 2A demonstrate an embodiment of recessed channel FinFETs.

Gate 110-2, like gate 110-1, can be realized using one or more metallic compositions, such as but not limited to, TiN, TaN, W, Mo, Ru, poly-Si, or a combination of these conductive materials. Inter-layer dielectric 106 can include, but is not limited to, an oxide region 103 and a nitride region 108. For example, oxide region 103 can be a $SiO_X$ region and nitride region 108 can be a $SiN_Y$ region.

Figure 4:
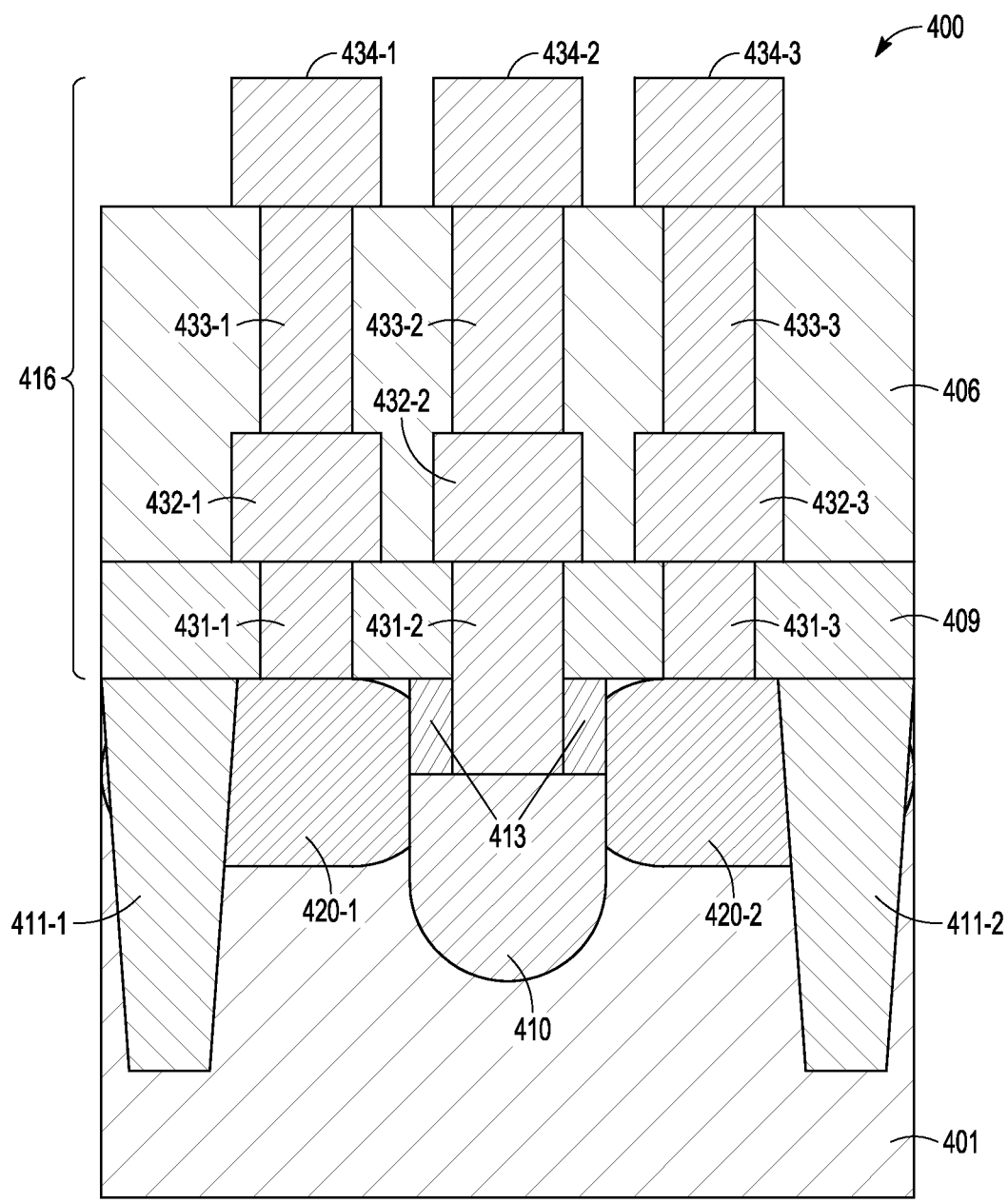
FIG. 4 is a cross-sectional view of another representation of a recessed channel FinFET for an integrated circuit similar to the structures associated with FIGS. 1A-1C, 2A-2B, and 3, according to various embodiments.

FIG. 4 is a cross-sectional view of another representation of a recessed channel FinFET 400 for an integrated circuit similar to the structures associated with FIGS. 1A-1C, 2A-2B, and 3. Recessed channel FinFET 400 can include one or more features associated with FIGS. 1A-1C, 2A-2B, and 3. The recessed channel FinFET can include source/drain regions 420-1 and 420-2 and a gate 410 recessed from source/drain regions 420-1 and 420-2 in a semiconductor region 401 that can act as a substrate. Semiconductor region 401 can be a silicon region. Dielectric 413 can separate source/drain regions 420-1 and 420-2 from gate 410. In this view, the fins defining the recess channel are not shown. Source/drain regions 420-1 and 420-2 and gate 410 are located between STIs 411-1 and 411-2. A dielectric 409, which can be an oxide, can provide an boundary to source/drain regions 420-1 and 420-2 and gate 410.

Source/drain regions 420-1 and 420-2 and gate 410 can be structured in an integrated circuit having a metal interconnection 416 of multiple levels. A first level of metals contacts can include metal contact 434-1 for source/drain region 420-1, metal contact 434-2 for gate 410, and metal contact 434-3 for source/drain region 420-2. A local interconnect metal 433-1 through an ILD 406 connects first level metal contact 434-1 to a lower metal contact 432-1. A local interconnect metal 433-2 through ILD 406 connects first level metal contact 434-2 to a lower metal contact 432-2. A local interconnect metal 433-3 through an ILD 406 connects first level metal contact 434-3 to a lower metal contact 432-3. Local interconnect metal 431-1 through dielectric 409 connects lower metal contact 432-1 to source/drain region 420-1. Local interconnect metal 431-2 through dielectric 409 connects lower metal contact 432-2 to gate 410. Local interconnect metal 431-3 through dielectric 409 connects lower metal contact 432-3 to source/drain region 420-2.

ILD 406 can be realized as a combination of a dielectric oxide and a dielectric nitride. ILD 406 can extend from recessed channel FinFET 400 to other sections of the integrated circuit in which recessed channel FinFET 400 is located. With the integrated circuit being a memory device, ILD 406 can extend from a periphery to a memory array through portions of the memory array. Recessed channel FinFET 400 can be implemented as part of a sense amplifier in the periphery. The memory device can include a recessed channel FinFET 400 for one or more sense amplifiers of the memory device.

Figure 5:
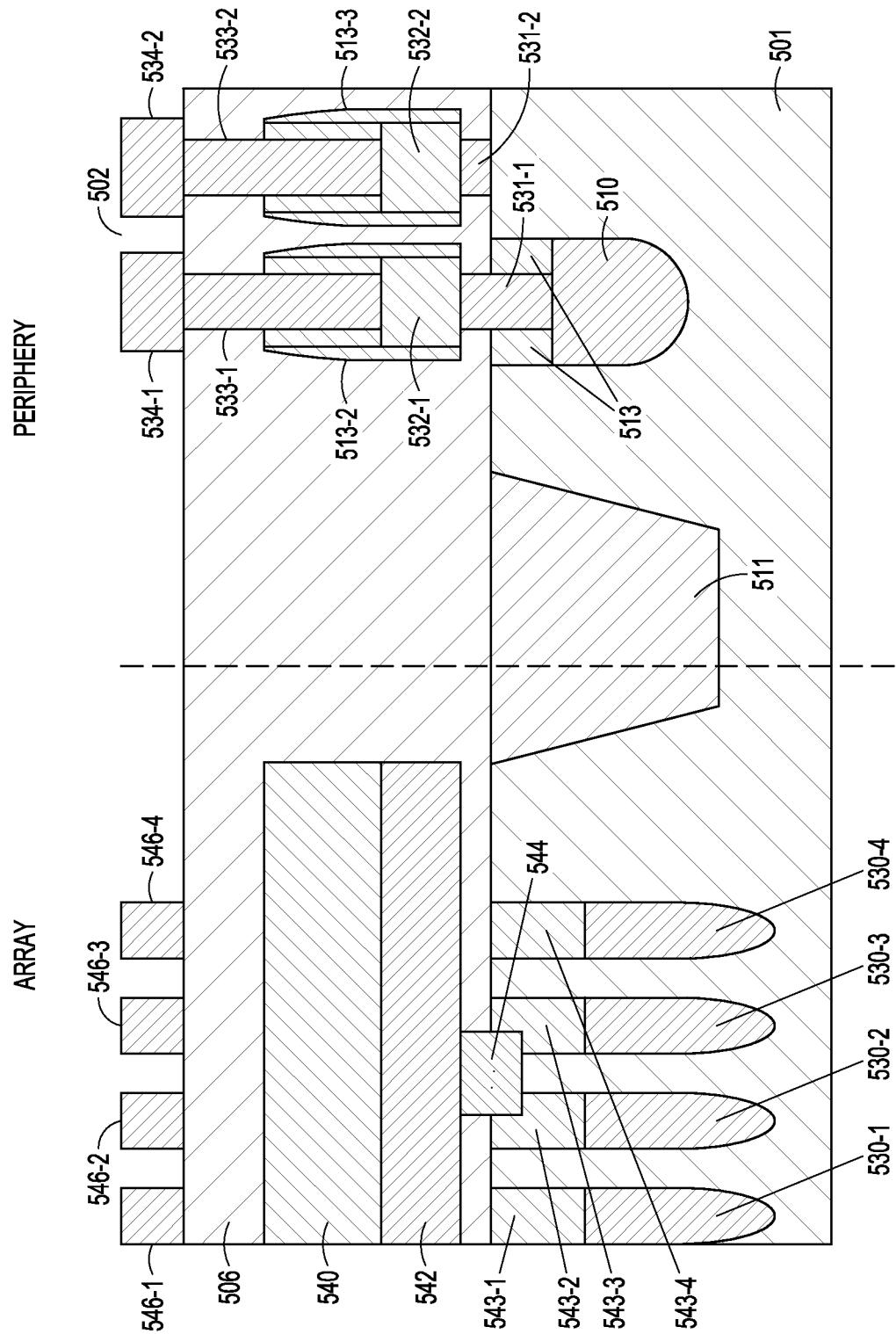
FIG. 5 is a representation of a memory device having an array and a periphery in a semiconductor region, according to various embodiments.

FIG. 5 is a representation of a memory device 500 having an array and a periphery in a semiconductor region 501. The array can include a digit line 540 connected to a digit line contact 544 by a metal region 542 in an ILD 506. Each of digit line 540, digit line contact 544, and metal region 542 can include one or more of TiN, TaN, W, Mo, Ru, poly-Si or combination of these metals. Digit line 540, digit line contact 544, and metal region 542 can be implemented having different conductive contents. The array can include access lines 530-1, 530-2, 530-3, and 530-4 buried in semiconductor region 501. Access lines 530-1, 530-2, 530-3, and 530-4 can include TiN, TaN, W, Mo, Ru, poly-Si or combination of these conductive materials. Access lines 530-1, 530-2, 530-3, and 530-4 can be separated from ILD 506 by dielectric regions 543-1, 543-2, 543-3, and 543-4. Dielectric regions 543-1, 543-2, 543-3, and 543-4 can be nitride regions such as, but not limited to, $SiN_Y$. The array can include re-distribution regions 546-1, 546-2, 546-3, and 546-4. Re-distribution regions 546-1, 546-2, 546-3, and 546-4 can include W, TiN, or combination of these conductive materials.

ILD 506 can be realized as a combination of a dielectric oxide and a dielectric nitride. ILD 506 can extend from periphery to the array of memory device 500. Various isolation regions 511, such as STIs, can be implemented between the periphery and the array.

A recessed channel FinFET 502, similar to recessed channel FinFET 400, can be located in the periphery. Recessed channel FinFET 502 can include a first level metal contact 534-1 for a gate 510. First level metal contact 534-1 can include the same conductive composition as re-distribution regions 546-1, 546-2, 546-3, and 546-4. A local interconnect metal 533-1 through an ILD 506 connects first level metal contact 534-1 to a lower metal contact 532-1. Lower metal contact 532-1 can include the same conductive composition as digit line 540. A dielectric 513-2 can be situated about portions of local interconnect metal 533-1 and lower metal contact 532-1, and a dielectric 513-3 can be situated about portions of local interconnect metal 533-2 and lower metal contact 532-2. Local interconnect metal 531-1 connects lower metal contact 532-1 to gate 510. Gate 510 is a buried recessed gate that can include TiN, TaN, W, Mo, Ru, poly-Si, or combination of these conductive materials. Local interconnect metals 531-1 and 533-1 can be formed with conductive materials appropriate for providing the contact. In some embodiments, gate 510 and access lines 530-1, 530-2, 530-3, and 530-4 can be formed in the same process. A dielectric 513 can be located above gate 510.

Other recessed channel FinFETs can be implemented in the periphery. For example, the periphery can include additional metal regions that can be used with other recessed channel FinFETs. The periphery can include a local interconnect metal 533-2 through ILD 506 that connects first level metal contact 534-2 to a lower metal contact 532-2. Local interconnect metal 531-2 can connect to a device below ILD 506.

Memory die size can be reduced, by example by about approximately three to four percent, with sense amplifier scaling using recessed channel fin transistors in which the channels along the tip regions of the fins allows for increased channel length over the same horizontal distance as conventional devices. Additional periphery area saving can be expected by additional use of recessed channel fin transistors in periphery devices other than sense amplifiers.

A memory device such as memory device 500 having a recessed channel FinFET in a periphery to a memory array, such as depicted in FIG. 5 but not limited to the arrangement of FIG. 5, can be formed in a number of different ways. One approach to forming the recessed channel FinFET in the periphery can include merging the formation of access lines in the memory array region of the memory device with formation of fins for one or more recessed channel FinFETs in the periphery to the memory array region. The one or more recessed channel FinFETs can be formed as portions of sense amplifiers for the memory device. Another approach to forming fins of the recessed channel FinFET merging with the formation of access lines can include using additional patterning for the circuit associated with the recessed channel FinFET.

In other approaches, the fins of the recessed channel FinFET can be formed separately from forming the access lines for the memory array. In such separate processing, additional hard mask can be used to transfer different pitch and depth for the array and the periphery. This separate processing can allow for control of depth and shape of the fins and recessed gate in the periphery different from the access lines for the memory array. In some embodiments, recessed gates in the periphery can extend from a common ILD region to shorter depths than embedded access lines from the common ILD region. In an approach for separate processing, work function control can be provided by using a metal gate. Materials for work function using a metal gate can include, but are not limited to, titanium aluminum nitride ($TiAl_XN_Y$), $TiN_X$, $TaN_X$, W, Mo, Ru, or combinations thereof, where X and Y can have different values for the different material compositions. In an approach for separate processing, work function control can be provided by using channel implants with respect to a n+ or p+ polysilicon gate.

Figure 6B:
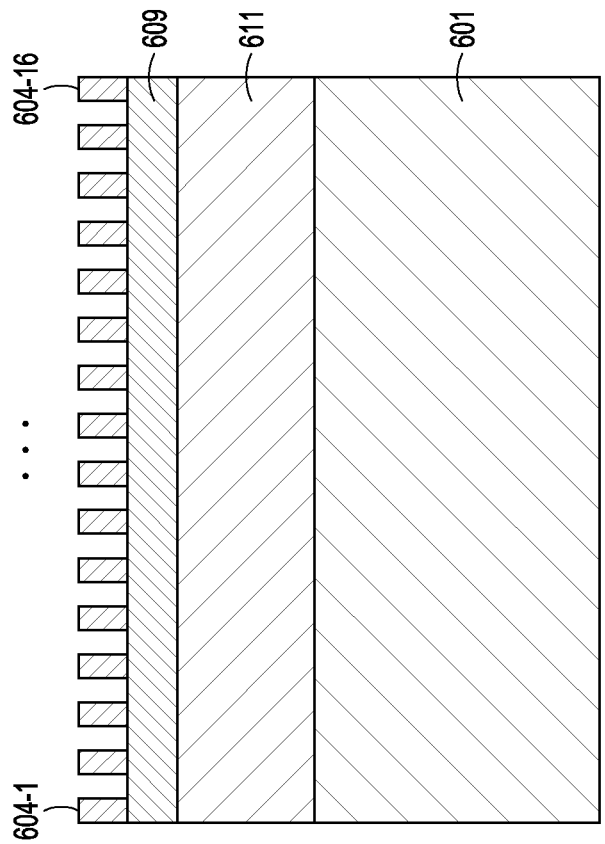
Figure 6A:
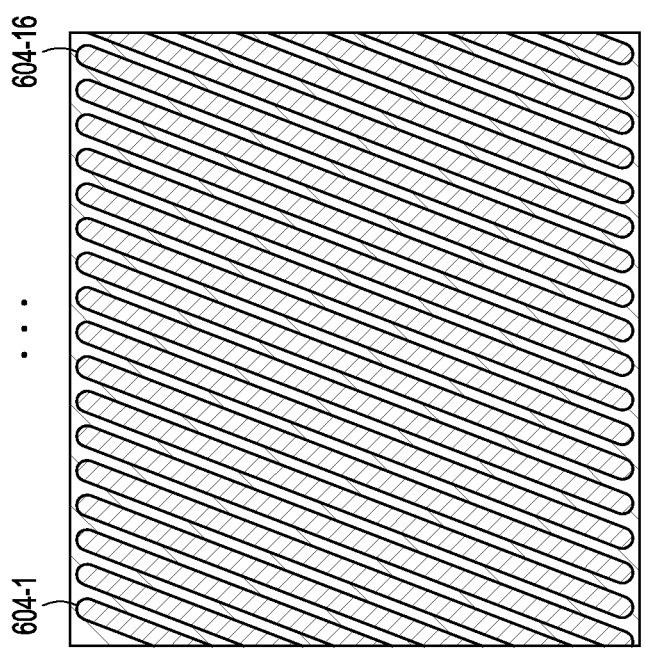
Figure 6D:
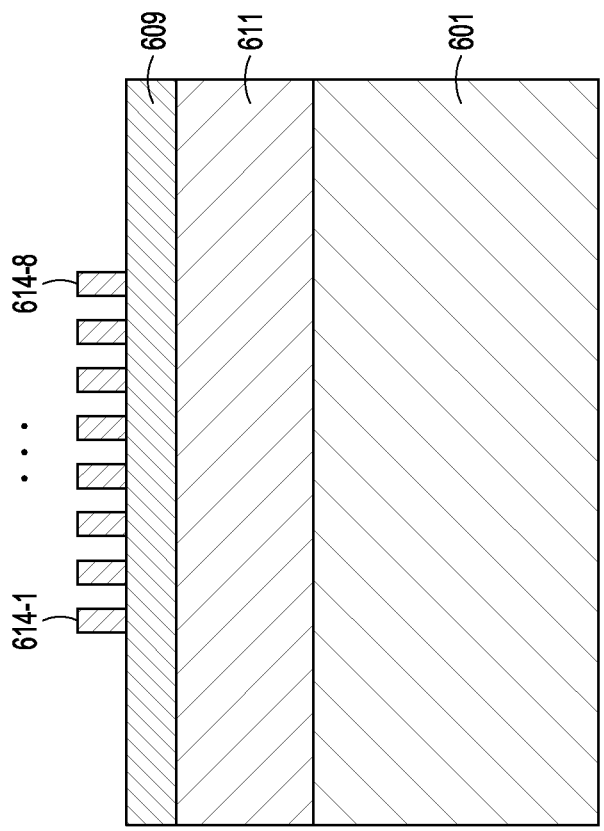
Figure 6C:
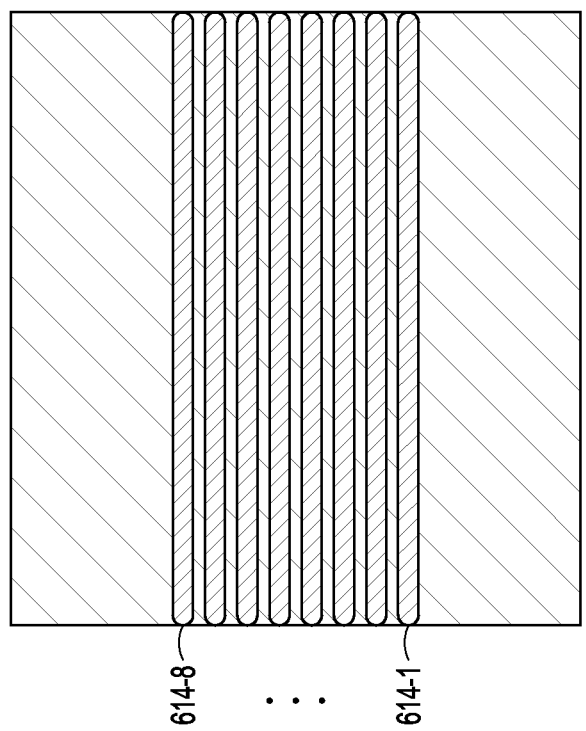

FIGS. 6A-17D illustrate example process procedures of an embodiment of forming a recessed channel FinFET in the periphery to the array of a memory device in which forming components of the recessed channel FinFET are merged with forming components for the array. In processes in which the periphery is formed separate from the array process, various procedures can be different but can follow similar processing. FIGS. 6A-6D show patterning for both array and cell for a recessed channel FinFET in the periphery, where the recessed channel FinFET can be for a sense amplifier or other device in the periphery. FIG. 6A is a top view of a region of openings in the array defined by structures 604-1 . . . 604-16. FIG. 6B is a cross-sectional view of the array corresponding to FIG. 6A, where structures 604-1 . . . 604-16 extend vertically from an STI hard mask 609 forming the openings between structures 604-1 . . . 604-16. The array can be formed with more or less than sixteen structures. STI hard mask 609 is formed on a first STI hard mask 611, which is formed on a substrate region 601. The substrate region 601 can be a silicon region. FIG. 6C is a top view of a region of openings in the cell of the periphery defined by structures 614-1 . . . 614-8, formed with the openings in the array of FIG. 6A. The cell of the periphery can be formed with more or less than eight structures. FIG. 6D is a cross-sectional view of the array corresponding to FIG. 6C, where structures 614-1 . . . 614-8 extend vertically from STI hard mask 609 forming the openings between structures 614-1 . . . 614-8. With the cell of the periphery being formed with the array, STI hard mask 609 in the periphery is on first STI hard mask 611 that is on substrate region 601.

Figure 7B:
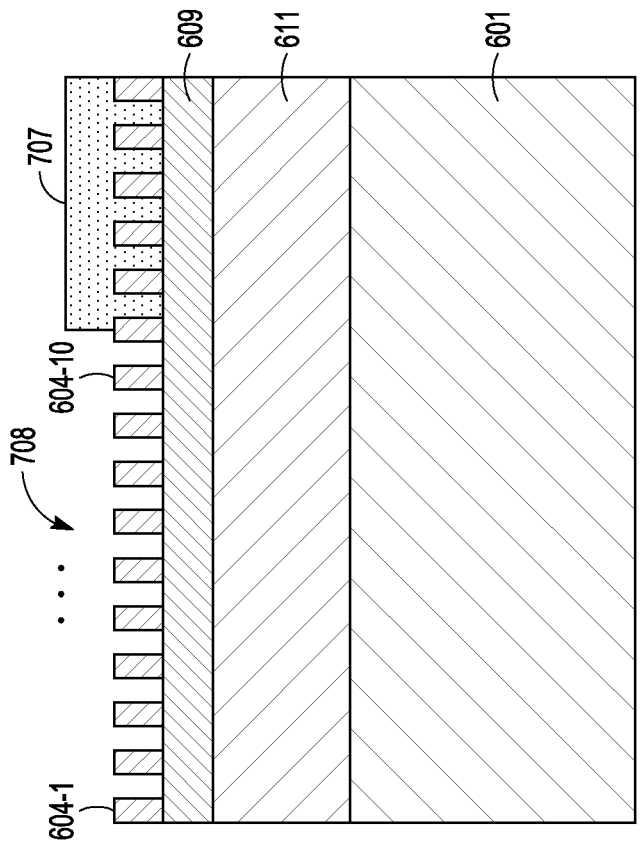
Figure 7A:
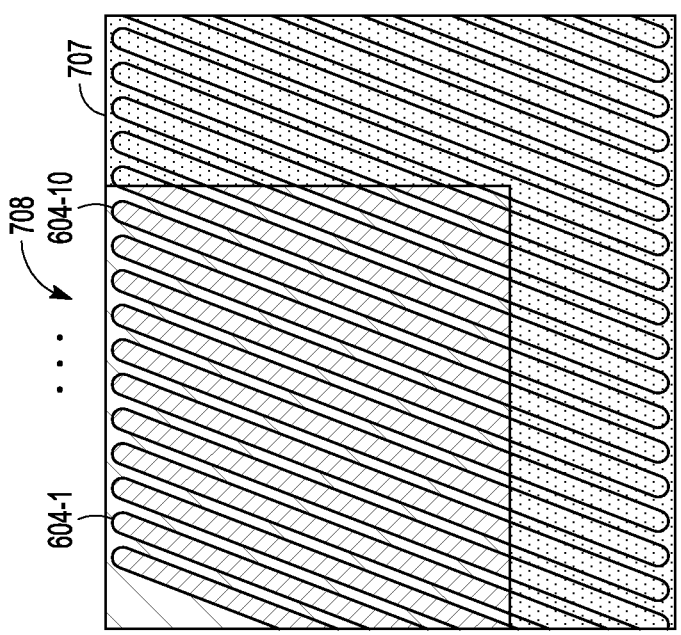
Figure 7D:
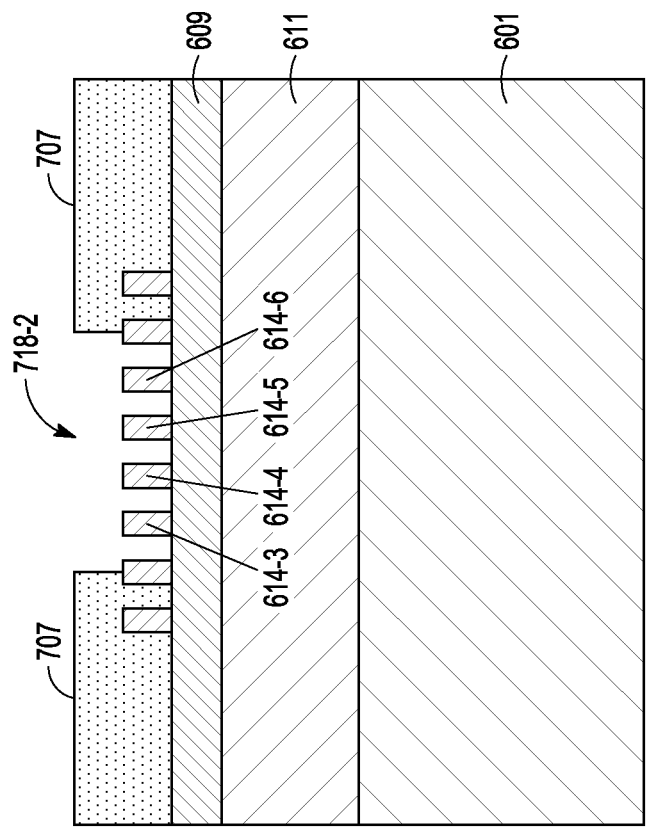
Figure 7C:
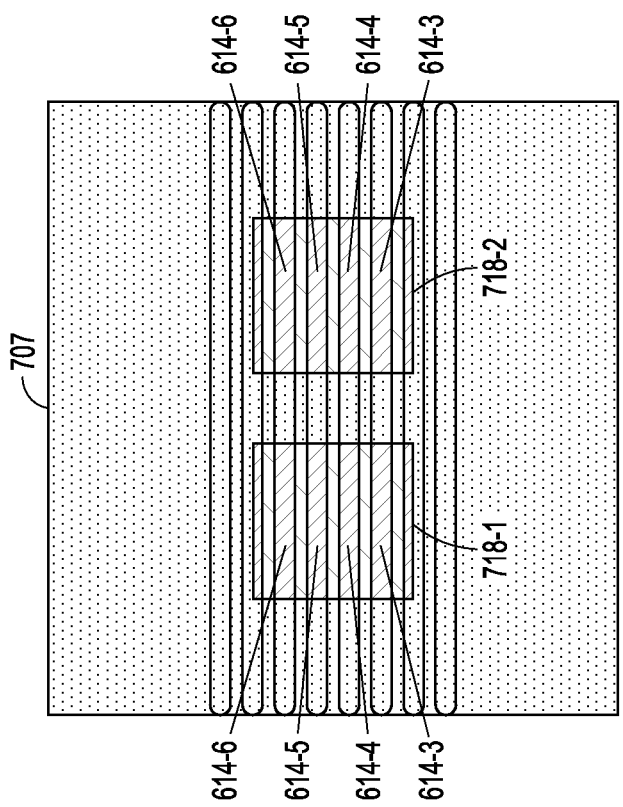

FIGS. 7A-7D show the structures of FIGS. 6A-6D after further processing. Photolithography has been performed to form a mask 707 in the array and the periphery. FIG. 7A is a top view after forming mask 707 over selected structures of the structures 604-1 . . . 604-16 in the array, leaving an open region 708. FIG. 7B is a cross-sectional view of the array of FIG. 7A. Mask 707 is formed on structures 604-11 . . . 604-16 with structures 604-1 . . . 604-10 in the open region 708. FIG. 7C is a top view after forming mask 707 over selected structures of the structures 614-1 . . . 614-8 in the periphery, leaving open regions 718-1 and 718-2. FIG. 7D is a cross-sectional view of the cell of the periphery of FIG. 7C. Mask 707 is formed on structures 614-1, 614-2, 614-7, and 614-8 with structures 614-3, 614-4, 614-5, and 614-6 in open region 718-2.

Figure 8B:
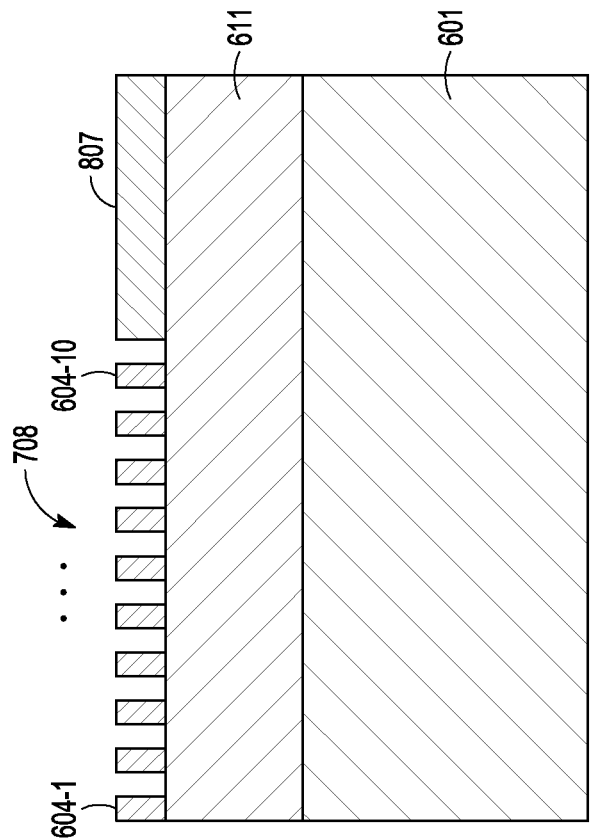
Figure 8A:
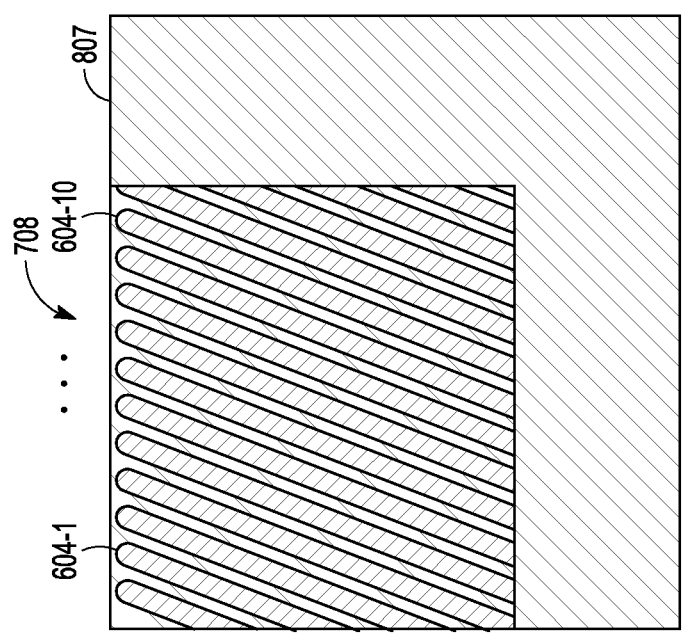

FIGS. 8A-8D show the structures of FIGS. 7A-7D after further processing. FIG. 8A shows a top view of the array and FIG. 8B shows a cross-sectional view associated with FIG. 8A. FIG. 8C shows a top view of the cell of the periphery and FIG. 8D shows a cross-sectional view associated with FIG. 8C. An in-situ etch has been applied to the array and the periphery. The patterns in the array and the periphery have been transferred to a hard mask 807 on first STI hard mask 611 in place of STI hard mask 609. Structures 604-1 . . . 604-10 in the array and structures 614-3, 614-4, 614-5, and 614-6 in the periphery will later be used to generate STI trenches.

Figure 9B:
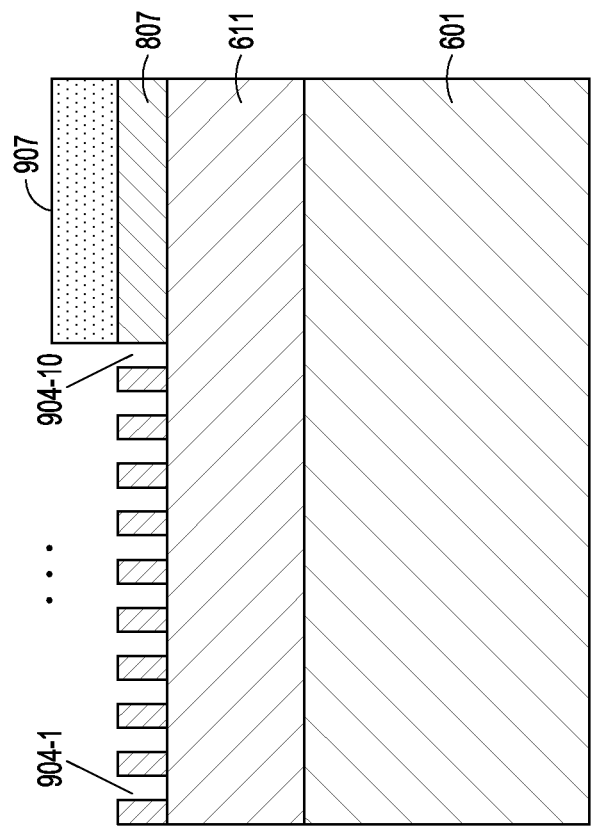
Figure 9A:
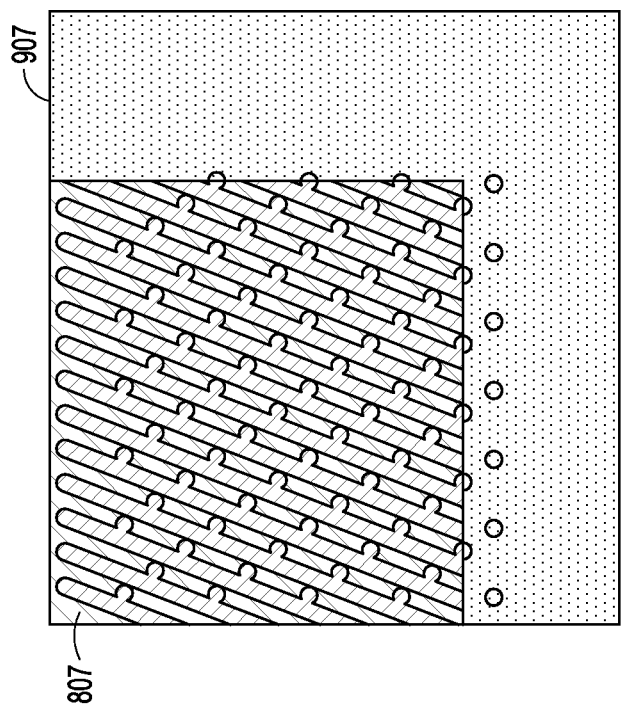
Figure 9D:
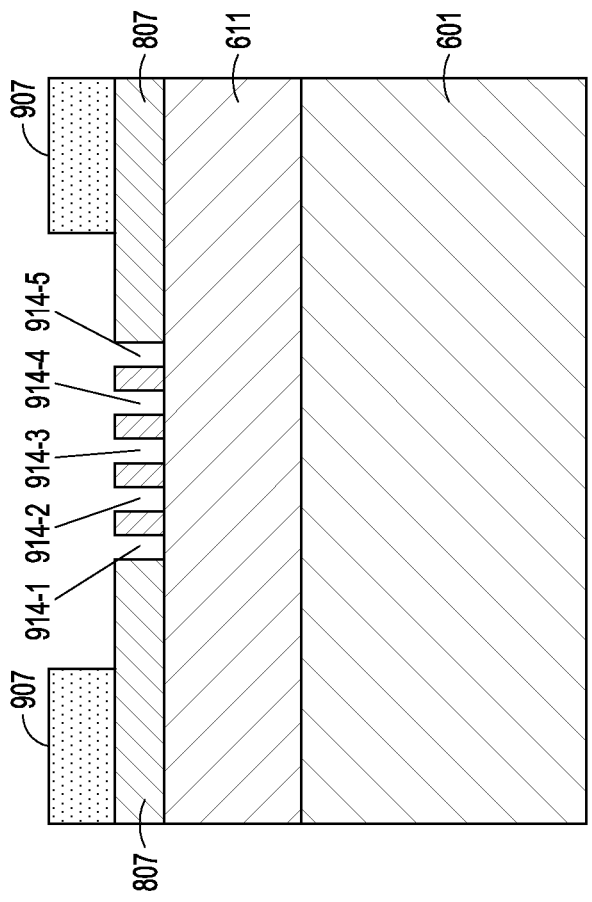
Figure 9C:
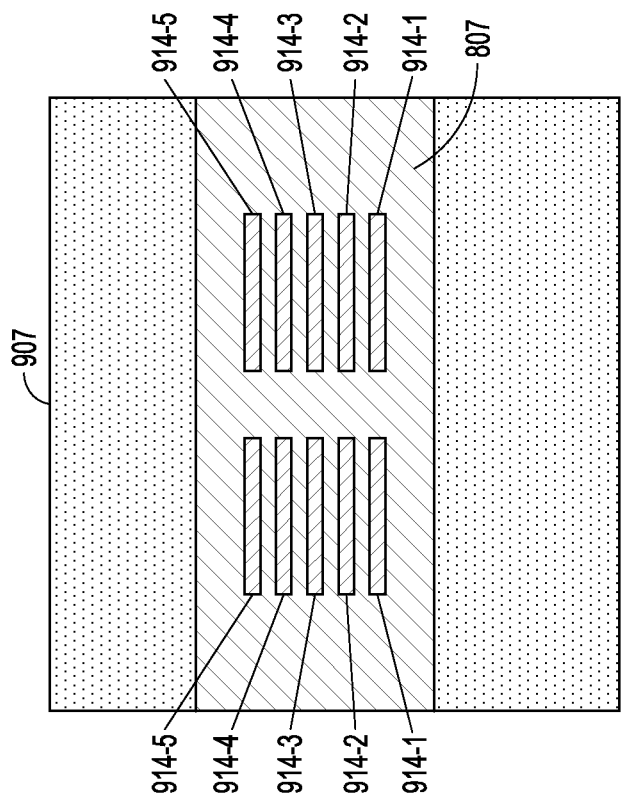

FIGS. 9A-9D show the structures of FIGS. 8A-8D after further processing. FIG. 9A shows a top view of the array and FIG. 9B shows a cross-sectional view associated with FIG. 9A. FIG. 9C shows a top view of the cell of the periphery and FIG. 9D shows a cross-sectional view associated with FIG. 9C. A photoresist region 907 has been provided to the array and to the periphery to prepare openings 904-1 . . . 904-10 in the array and openings 914-1 . . . 914-5 in two regions.

Figure 10B:
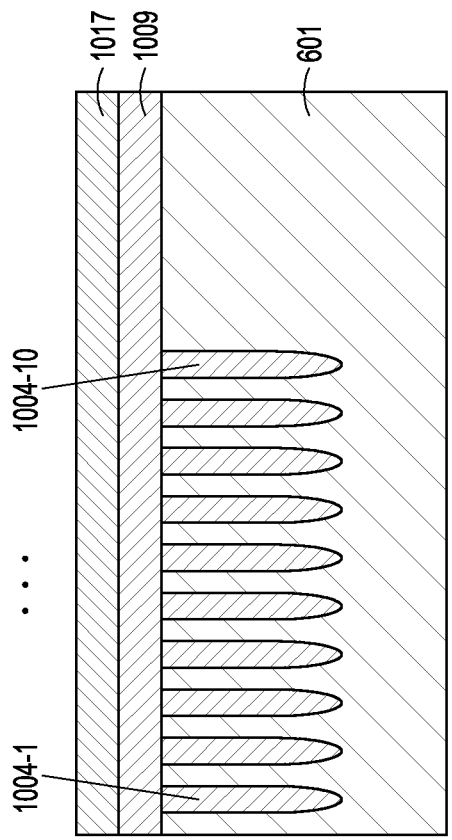
Figure 10A:
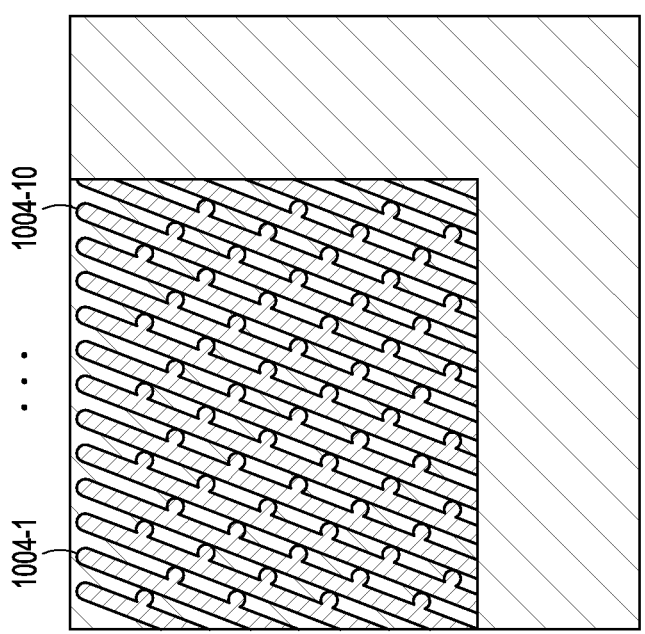
Figure 10D:
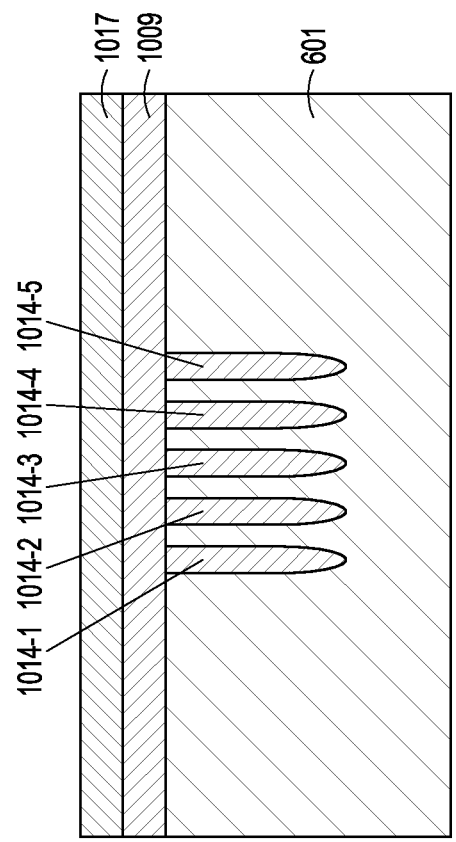
Figure 10C:
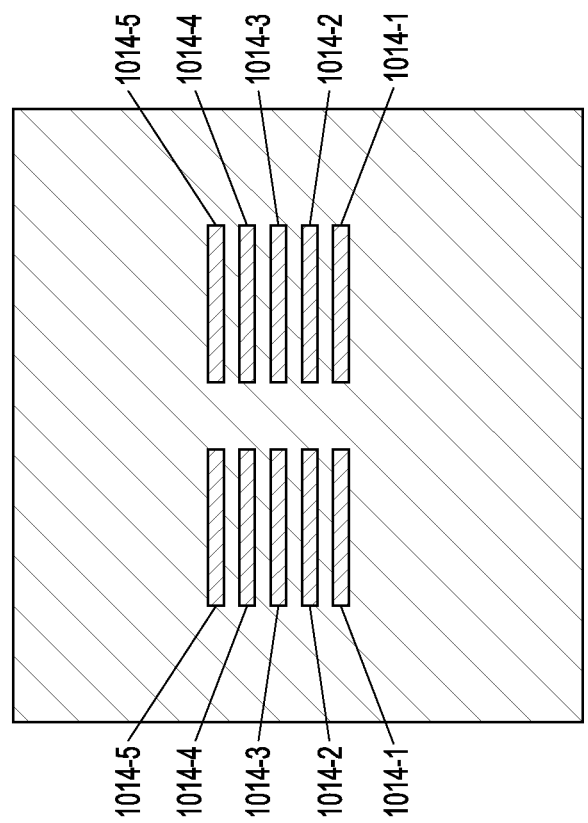

FIGS. 10A-10D show the structures of FIGS. 9A-9D after further processing. FIG. 10A shows a top view of the array and FIG. 10B shows a cross-sectional view associated with FIG. 10A. FIG. 10C shows a top view of the cell of the periphery and FIG. 10D shows a cross-sectional view associated with FIG. 10C. Etching has been applied to extend openings 904-1 . . . 904-10 in the array into substrate region 601 and openings 914-1 . . . 914-5 in two regions in substrate region 601 and to remove photoresist region 907, hard mask 807, and first STI hard mask 611. Photoresist region 907, hard mask 807, and first STI hard mask 611 are removed after extending openings 904-1 . . . 904-10 and openings 914-1 . . . 914-5. After extending openings 904-1 . . . 904-10 and openings 914-1 . . . 914-5, the openings can be filled with an oxide such as, but not limited to, silicon oxide to form oxide extensions 1004-1 . . . 1004-10 in the array, oxide extensions 1014-1 . . . 1014-5 in the periphery, and oxide region 1009. Nitride region 1017 has been formed on oxide region 1009. Nitride region 1017 can be formed by $SiN_X$ deposition.

Figure 11B:
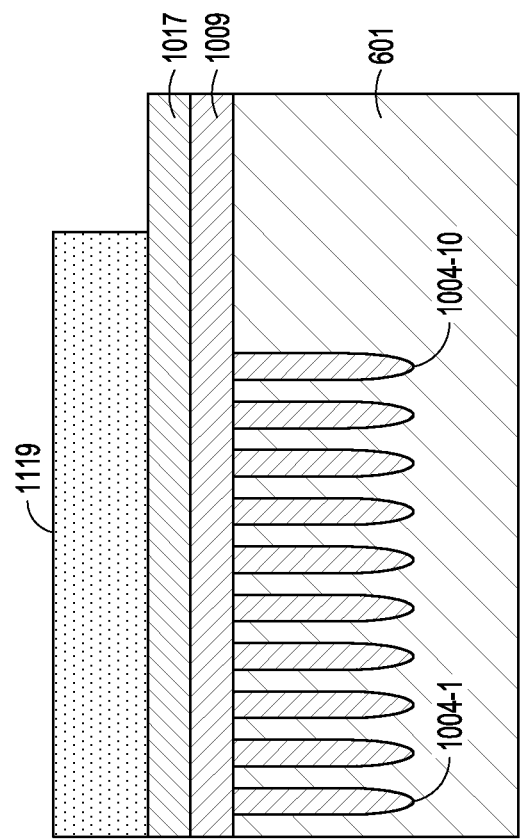
Figure 11A:
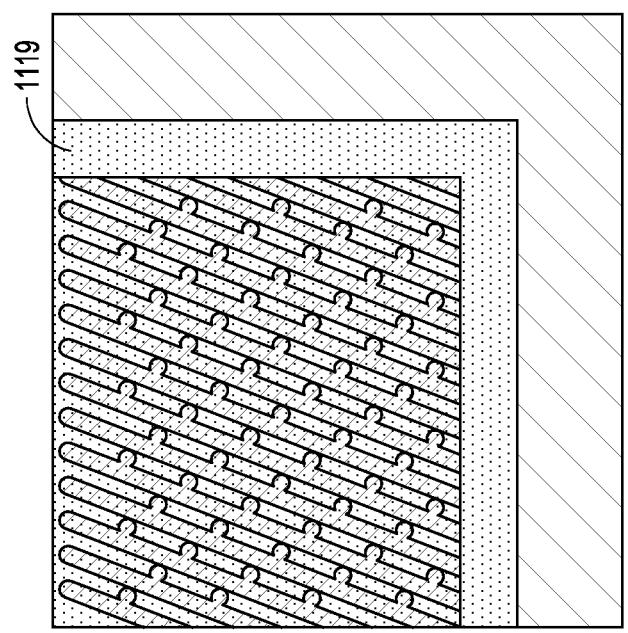
Figure 11C:
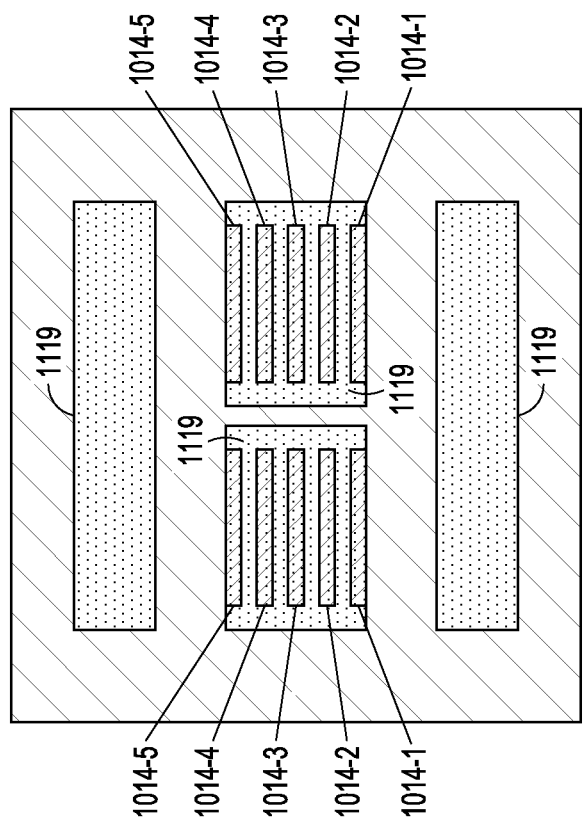
Figure 11D:
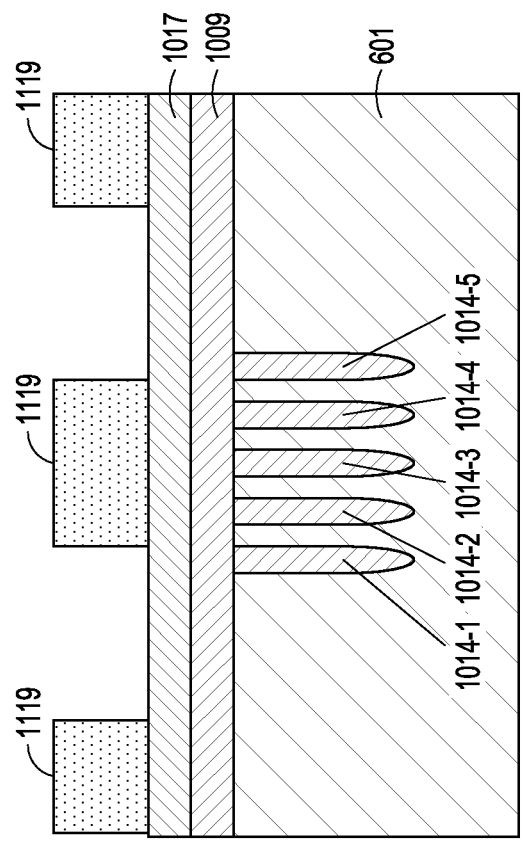

FIGS. 11A-11D show the structures of FIGS. 10A-10D after further processing. FIG. 11A shows a top view of the array and FIG. 11B shows a cross-sectional view associated with FIG. 11A. FIG. 11C shows a top view of the cell of the periphery and FIG. 11D shows a cross-sectional view associated with FIG. 11C. A photoresist pattern 1119 has been formed to control the exact number of fins to be formed in the periphery using oxide extensions 1014-1 . . . 1014-5 in the periphery and to form access lines in the array using oxide extensions 1004-1 . . . 1004-10.

Figure 12B:
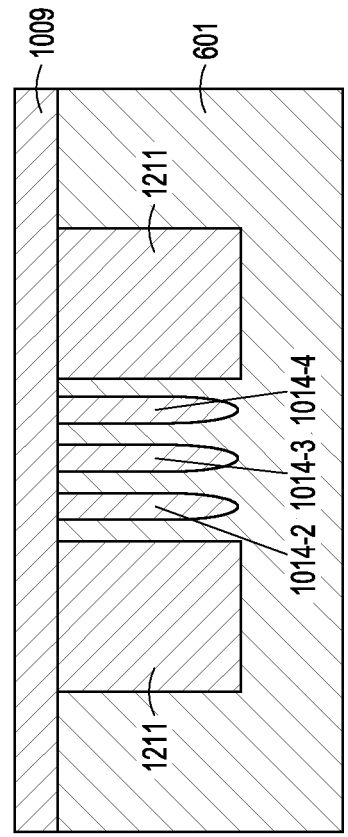
Figure 12A:
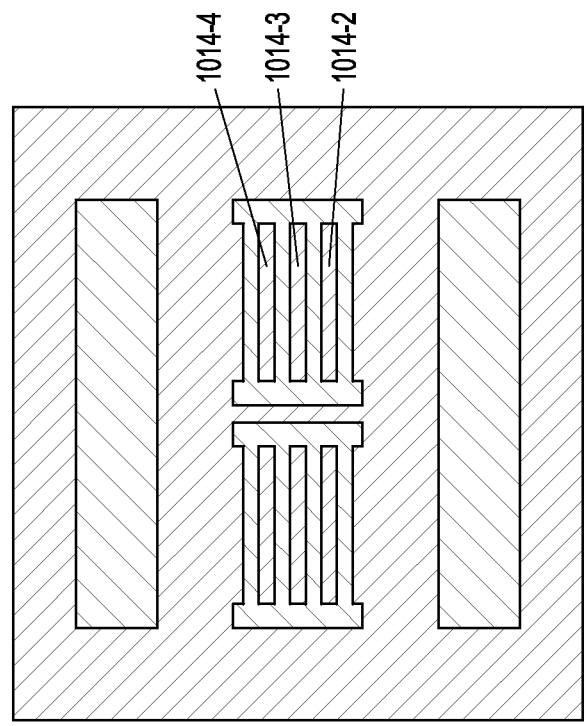

FIGS. 12A-12B show the structures of FIGS. 11C-11D after further processing. FIG. 12A shows a top view of the cell of the periphery with two regions effectively being processed and FIG. 12B shows a cross-sectional view associated with FIG. 12A. An etch has been performed and STIs 1211 have been formed. STIs 1211 can be oxide regions formed with a spin-on dielectric (SD) fill such as by pinch-off or any other scheme. The processing can include chemical mechanical planarization (CMP) and stripping of nitride region 1017.

Figure 13B:
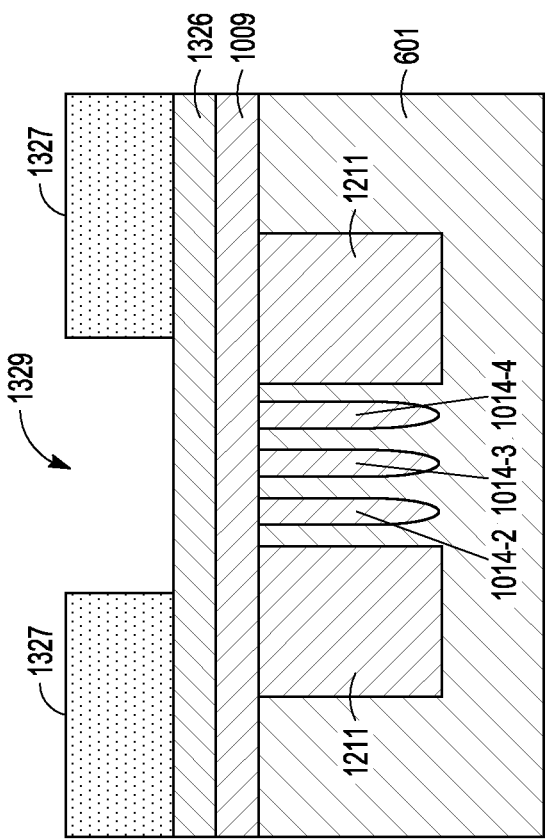
Figure 13A:
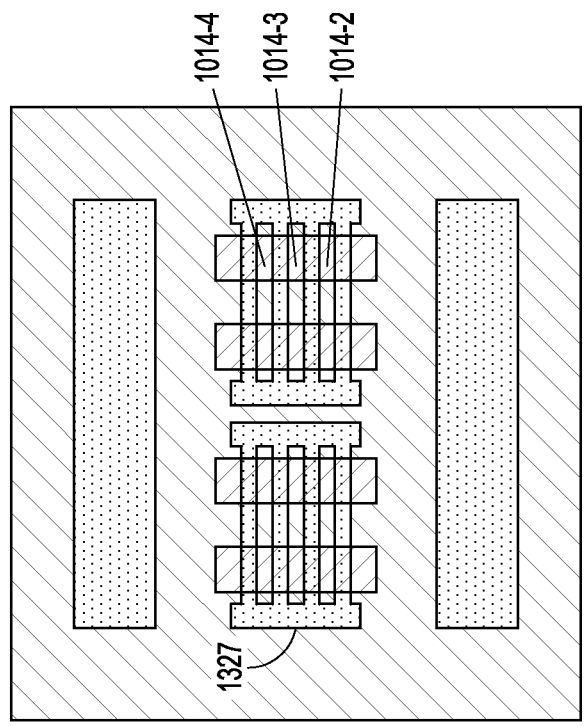

FIGS. 13A-13B show the structures of FIGS. 12A-12B after further processing. FIG. 13A shows a top view of the cell of the periphery with two regions effectively being processed and FIG. 13B shows a cross-sectional view associated with FIG. 13A. A hard mask 1326 and mask 1327, defining opening 1329, have been formed. Mask 1327 defining opening 1329 provides a mechanism to form a recessed gate for a recessed channel FinFET in the periphery.

Figure 14B:
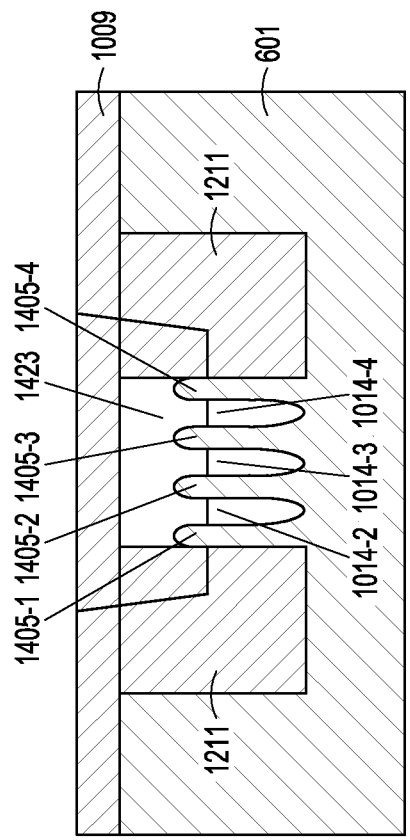
Figure 14A:
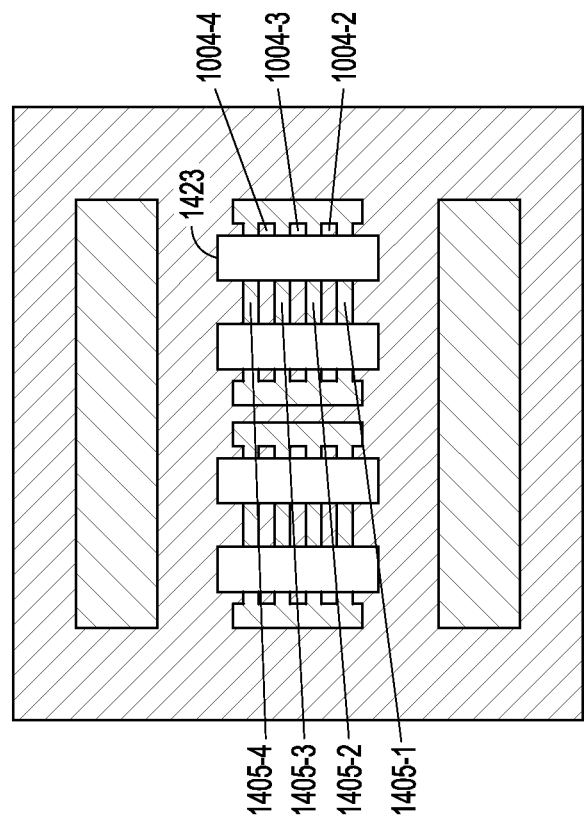

FIGS. 14A-14B show the structures of FIGS. 13A-13B after further processing. FIG. 14A shows a top view of the cell of the periphery with two regions effectively being processed and FIG. 14B shows a cross-sectional view associated with FIG. 14A. An etch has been performed, generating trench 1423 in the periphery. The etch can also be performed in the array in forming access lines for the array. Optionally, the etch can be separated between array and periphery to control independent trench depth in the periphery. Another hard mask may be used for pattern transfer in this separate process. The etching exposes ends (tips) of the regions between oxide extensions 1014-1 . . . 1014-5 in the periphery. These regions between oxide extensions 1014-1 . . . 1014-5 form fin structures 1405-1, 1405-2, 1405-3, and 1405-4 between STIs 1211.

FIGS. 15A-15B show the structures of FIGS. 14A-14B after further processing. FIG. 15A shows a top view of the cell of the periphery with two regions effectively being processed and FIG. 15B shows a cross-sectional view associated with FIG. 15A. A dielectric 1415 has be formed on the tips of fin structures 1405-1, 1405-2, 1405-3, and 1405-4. Dielectric 1415 is to be the gate dielectric defining the channel of the recessed channel FinFET being formed in the periphery. The dielectric 1415 can include one or more dielectric compositions. Depending on the composition for dielectric 1415 can be formed in a number of ways including oxide deposition, in-situ steam generation (ISSG), and atomic layer deposition (ALD). The thickness of dielectric 1415 can be adjusted, for example, by removing a portion of ALD oxide formed to form a thinner gate dielectric. The ALD oxide can be removed by a vapor etch or a wet process.

FIGS. 16A-16B show the structures of FIGS. 15A-15B after further processing. FIG. 16A shows a top view of the cell of the periphery with two regions effectively being processed and FIG. 16B shows a cross-sectional view associated with FIG. 16A. As shown in FIG. 16B, a metal has been formed. The metal can be formed by an appropriate deposition process. The metal has been etched back to form gate 1610-1 that is recessed from oxide region 1009 from which source/drain regions will extend. FIG. 16A shows that other metal gates 1610-2, 1610-3, and 1610-4 have also been formed in this example embodiment of forming a recessed channel FinFET in a periphery to an array of a memory device. Different work function material can be used to provide a threshold voltage ($V_T$) adjustment for a p-channel device. A nitride region 1613 can be deposited on gate 1610-1. Nitride region 1613 can be a $SiN_X$ region.

Figure 17A:
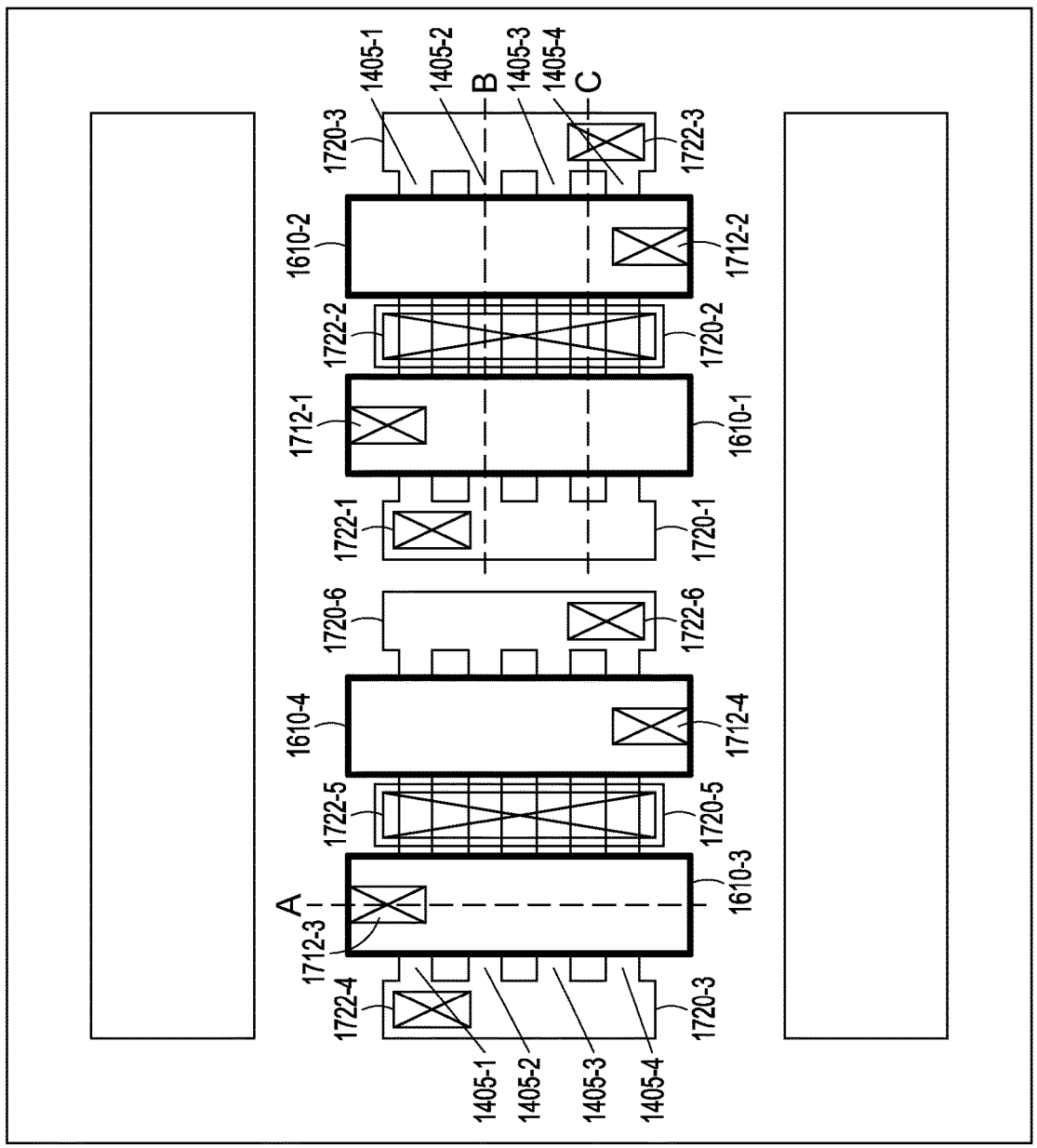

FIG. 17A shows a top view of the two regions formed in the processing associated with FIGS. 6A-16B. Each of the two regions includes transistors sharing a common source/drain region similar to the architecture 100 of FIG. 1A. A first region includes source/drain regions 1720-1, 1720-2, and 1720-3 and gates 1610-1 and 1610-2 arranged with fin structures 1405-1, 1405-2, 1405-3, and 1405-4. A metal contact 1722-1 is connected to source/drain region 1720-1; metal contact 1722-2 is connected to source/drain region 1720-2; and metal contact 1722-3 is connected to source/drain region 1720-3. A metal contact 1712-1 is connected to gate 1610-1 and metal contact 1712-2 is connected to gate 1610-2. The second region, to the left of the first region in FIG. 1A, includes source/drain regions 1720-4, 1720-5, and 1720-6 and gates 1610-3 and 1610-4 arranged with fin structures 1405-1, 1405-2, 1405-3, and 1405-4. A metal contact 1722-4 is connected to source/drain region 1720-4; metal contact 1722-5 is connected to source/drain region 1720-5; and metal contact 1722-6 is connected to source/drain region 1720-6. A metal contact 1712-3 is connected to gate 1610-3 and metal contact 1712-4 is connected to gate 1610-4.

Figure 17B:
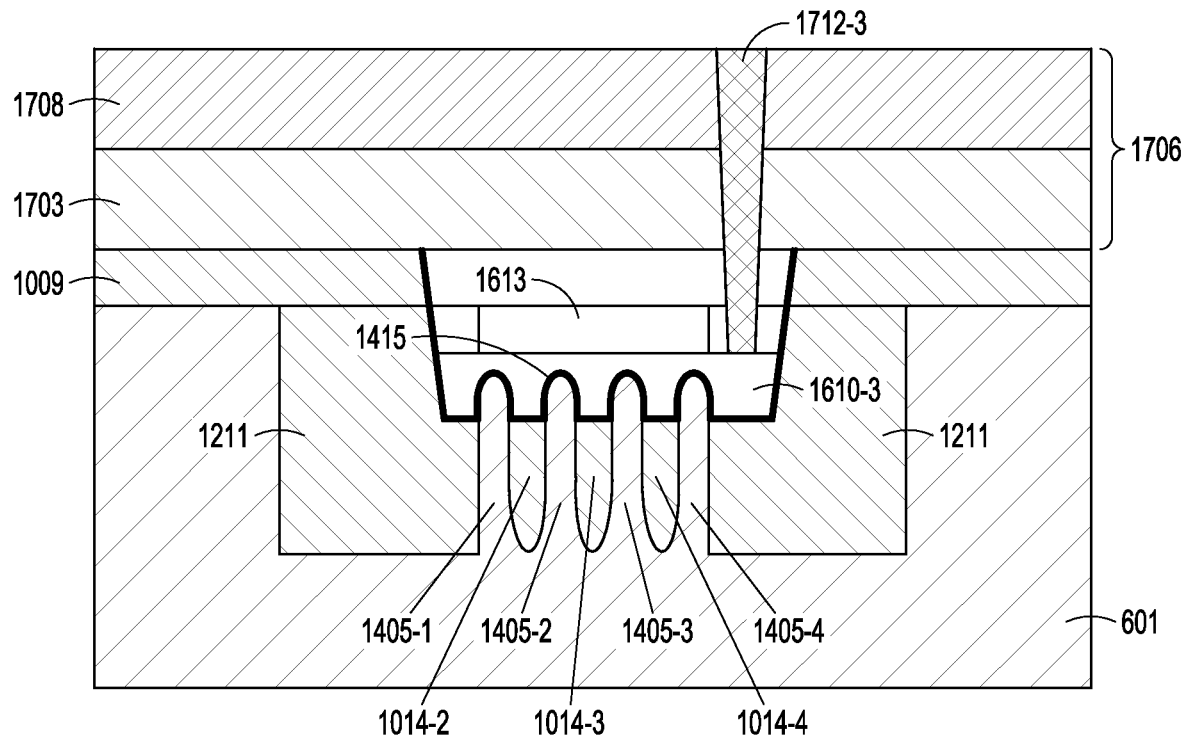

FIG. 17B is a cross-sectional view along line A in the top view of FIG. 17A, where contact 1712-3 is connected to gate 1610-3. Contact 1712-3 is through ILD 1706 that can include nitride region 1708 and oxide region 1703. Gate 1610-3 is separated from fin structures 1405-1, 1405-2, 1405-3, and 1405-4 by gate dielectric 1415 and separated from oxide region 1009 by nitride region 1613. Gate dielectric 1415 is recessed from a top of gate 1610-3, where gate 1610-3 is recessed from oxide region 1009. Fin structures 1405-1, 1405-2, 1405-3, and 1405-4 are separated from each other on a pair-wise basis by oxide extensions 1014-2, 1014-3, and 1014-4 and STIs 1211. Fin structures 1405-1, 1405-2, 1405-3, and 1405-4 can extend in a semiconductor substrate region 601 vertically from the bottom level of STIs 1211.

Figure 17C:
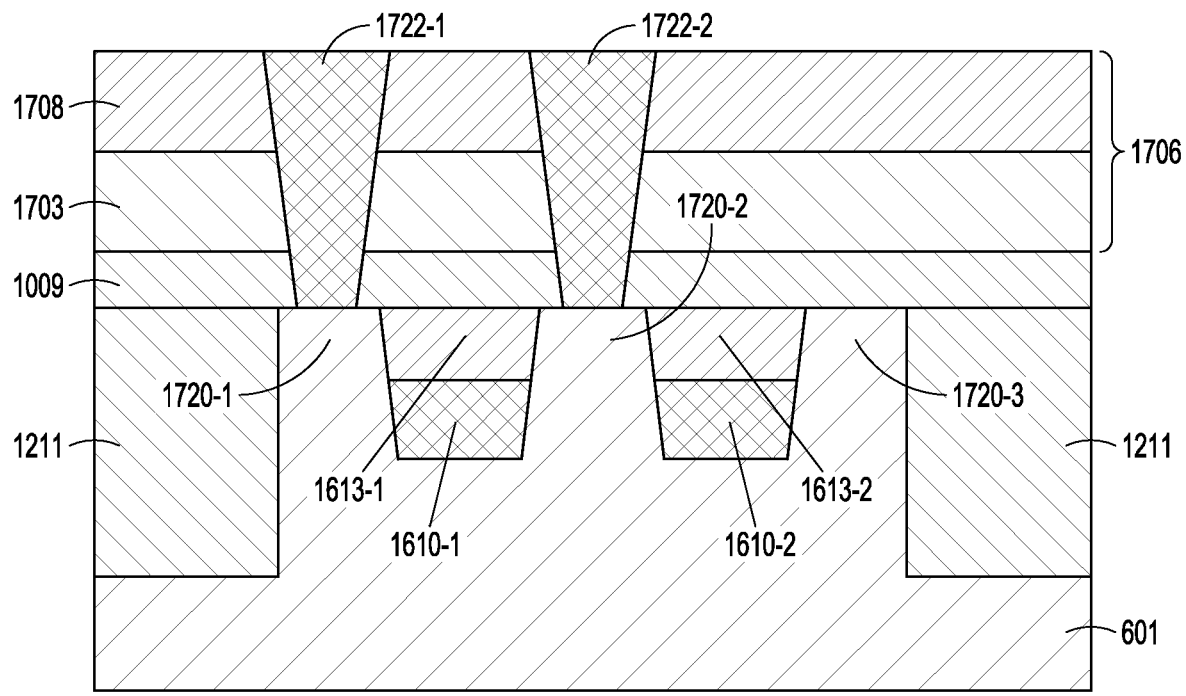

FIG. 17C is a cross-sectional view along line B in the top view of FIG. 17A, where line B is along fin structure 1405-2. Along line B is shown source/drain regions 1720-1, 1720-2, and 1720-3, where gate 1610-1 is between source/drain regions 1720-1 and 1720-2, and gate 1610-2 is between source/drain regions 1720-2 and 1720-3. Source/drain regions 1720-1, 1720-2, and 1720-3 are located between STIs 1211. Metal contact 1722-1 connects to source/drain region 1720-1 through ILD 1706 that can include nitride region 1708 and oxide region 1703. Metal contact 1722-2 connects to source/drain region 1720-2 through ILD 1706. Gate 1610-1 is separated from oxide region 1009 by nitride region 1613-1 and gate 1610-2 is separated from oxide region 1009 by nitride region 1613-2. With source/drain regions 1720-1, 1720-2, and 1720-3 extending downward from oxide region 1009, gates 1610-1 and 1610-2 are recessed from source/drain regions 1720-1, 1720-2, and 1720-3.

Figure 17D:
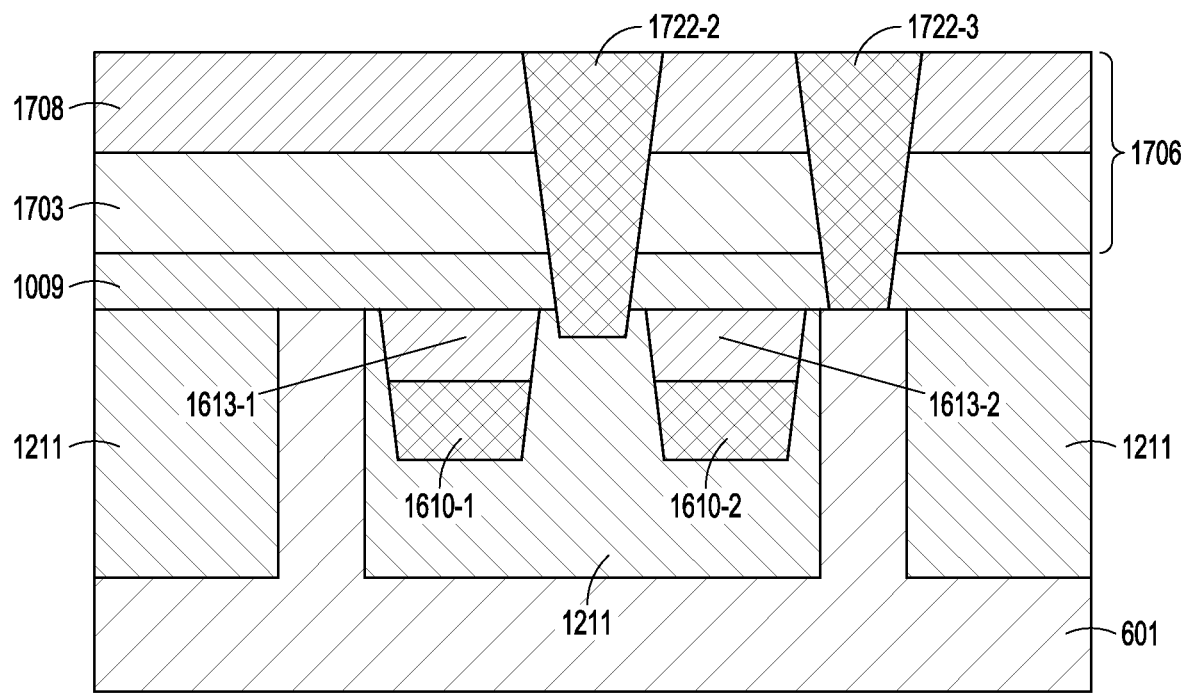

FIG. 17D is a cross-sectional view along line C in top view of FIG. 17A, where line C is along STI material between fin structures 1405-3 and 1405-4. Along line C is shown metal contacts 1722-2 and 1722-3 through ILD 1706 that can include nitride region 1708 and oxide region 1703. Gate 1610-1 is separated from oxide region 1009 by nitride region 1613-1 and gate 1610-2 is separated from oxide region 1009 by nitride region 1613-2. Gates 1610-1 and gates 1610-2 are buried gates below oxide region 1009.

Figure 18:
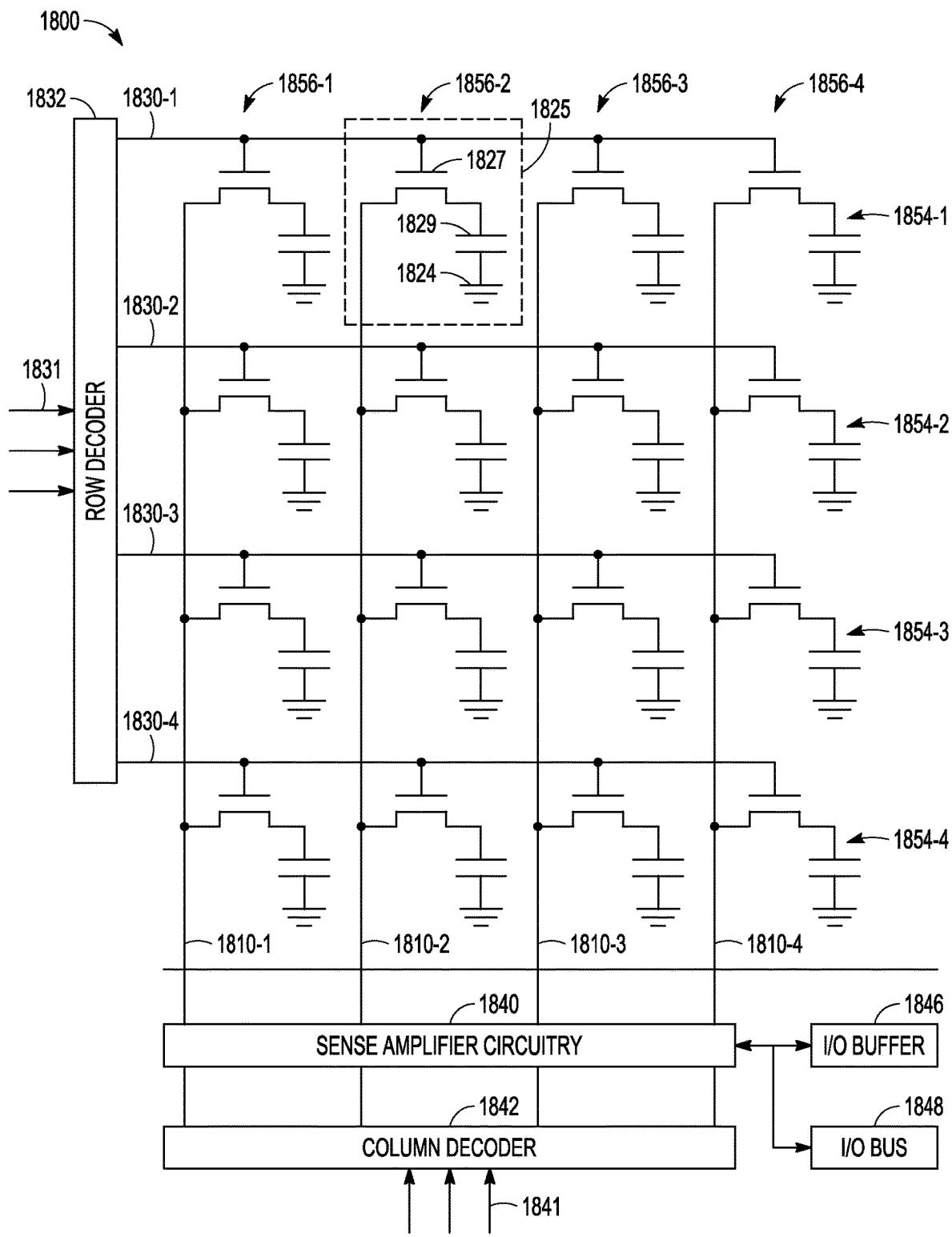
FIG. 18 is a schematic of an example memory device that can include an architecture having a memory array region and a periphery to the memory array that can include one or more recessed channel FinFETs, according to various embodiments.

FIG. 18 is a schematic of an embodiment of an example DRAM device 1800 that can include an architecture having a memory array region and a periphery to the memory array that can include one or more recessed channel FinFETs. DRAM device 1800 includes an array of memory cells 1825 (only one being labeled in FIG. 18 for ease of presentation) arranged in rows 1854-1, 1854-2, 1854-3, and 1854-4 and columns 1856-1, 1856-2, 1856-3, and 1856-4. For simplicity and ease of discussion, the array is shown in only two dimensions, but the array can be extended into the third dimension. Further, while only four rows 1854-1, 1854-2, 1854-3, and 1854-4 and four columns 1856-1, 1856-2, 1856-3, and 1856-4 of four memory cells are illustrated, DRAM devices like DRAM device 1800 can have significantly more memory cells 1825 (e.g., tens, hundreds, or thousands of memory cells) per row or per column.

Each memory cell 1825 can include a single transistor 1827 and a single capacitor 1829, which is commonly referred to as a 1T1C (one-transistor—one capacitor cell). One plate of capacitor 1829, which can be termed the "node plate," is connected to the drain terminal of transistor 1827, whereas the other plate of the capacitor 1829 is connected to ground 1824. Each capacitor 1829 within the array of 1T1C cells 1825 typically serves to store one bit of data, and the respective transistor 1827 serves as an access device to write to or read from capacitor 1829.

The transistor gate terminals within each row of rows 1854-1, 1854-2, 1854-3, and 1854-4 are portions of respective access lines 1830-1, 1830-2, 1830-3, and 1830-4 (alternatively referred to as "word lines"), and the transistor source terminals within each of columns 1856-1, 1856-2, 1856-3, and 1856-4 are electrically connected to respective digit lines 1810-1, 1810-2, 1810-3, and 1810-4 (alternatively referred to as "bit lines"). A row decoder 1832 can selectively drive the individual access lines 1830-1, 1830-2, 1830-3, and 1830-4, responsive to row address signals 1831 input to row decoder 1832. Driving a given access line at a high voltage causes the access transistors within the respective row to conduct, thereby connecting the storage capacitors within the row to the respective data lines, such that charge can be transferred between the data lines and the storage capacitors for read or write operations. Both read and write operations can be performed via sense amplifier circuitry 1840, which can transfer bit values between the memory cells 1825 of the selected row of the rows 1854-1, 1854-2, 1854-3, and 1854-4 and input/output buffers 1846 (for write/read operations) or external input/output data buses 1848. Sense amplifier circuitry 1840 can include one or more recessed channel FinFETs.

A column decoder 1842 responsive to column address signals 1841 can select which of the memory cells 1825 within the selected row is read out or written to. Alternatively, for read operations, the storage capacitors 1829 within the selected row can be read out simultaneously and latched, and the column decoder 1842 can then select which latch bits to connect to the output data bus 1848. Since read-out of the storage capacitors destroys the stored information, the read operation is accompanied by a simultaneous rewrite of the capacitor charge. Further, in between read/write operations, the capacitor charge is repeatedly refreshed to prevent data loss. Details of read/rewrite, write, and refresh operations are well-known to those of ordinary skill in the art.

DRAM device 1800 may be implemented as an integrated circuit within a package that includes pins for receiving supply voltages (e.g., to provide the source and gate voltages for the transistors 1827) and signals (including data, address, and control signals). FIG. 18 depicts DRAM device 1800 in simplified form to illustrate basic structural components, omitting many details of the memory cells 1825 and associated access lines 1830-1, 1830-2, 1830-3, and 1830-4 and digit lines 1810-1, 1810-2, 1810-3, and 1810-4 as well as the peripheral circuitry. For example, in addition to the row decoder 1832 and column decoder 1842, sense amplifier circuitry 1840, and buffers 1846, DRAM device 1800 can include further peripheral circuitry, such as a memory control unit that controls the memory operations based on control signals (provided, e.g., by an external processor), additional input/output circuitry, etc. Details of such peripheral circuitry are generally known to those of ordinary skill in the art and not further discussed herein.

In two-dimensional (2D) DRAM arrays, the rows 1854-1, 1854-2, 1854-3, and 1854-4 and columns 1856-1, 1856-2, 1856-3, and 1856-4 of memory cells 1825 are arranged along a single horizontal plane (i.e., a plane parallel to the layers) of the semiconductor substrate, e.g., in a rectangular lattice with mutually perpendicular horizontal access lines 1830-1, 1830-2, 1830-3, and 1830-4 and digit lines 1810-1, 1810-2, 1810-3, and 1810-4. In 3D DRAM arrays, the memory cells 1825 are arranged in a 3D lattice that encompasses multiple vertically stacked horizontal planes corresponding to multiple device tiers of a multi-tier substrate assembly, with each device tier including multiple parallel rows of cells 1825 whose transistor gate terminals are connected by horizontal access lines such as access lines 1830-1, 1830-2, 1830-3, and 1830-4. (A "device tier," as used herein, can include multiple layers (or levels) of materials, but forms the components of memory devices of a single horizontal tier of memory cells.) Digit lines 1810-1, 1810-2, 1810-3, and 1810-4 extend vertically through all or at least a vertical portion of the multi-tier structure, and each of the digit lines 1810-1, 1810-2, 1810-3, and 1810-4 connects to the transistor source terminals of respective vertical columns 1856-1, 1856-2, 1856-3, and 1856-4 of associated memory cells 1825 at the multiple device tiers. This 3D configuration of memory cells enables further increases in bit density compared with 2D arrays.

Figure 19:
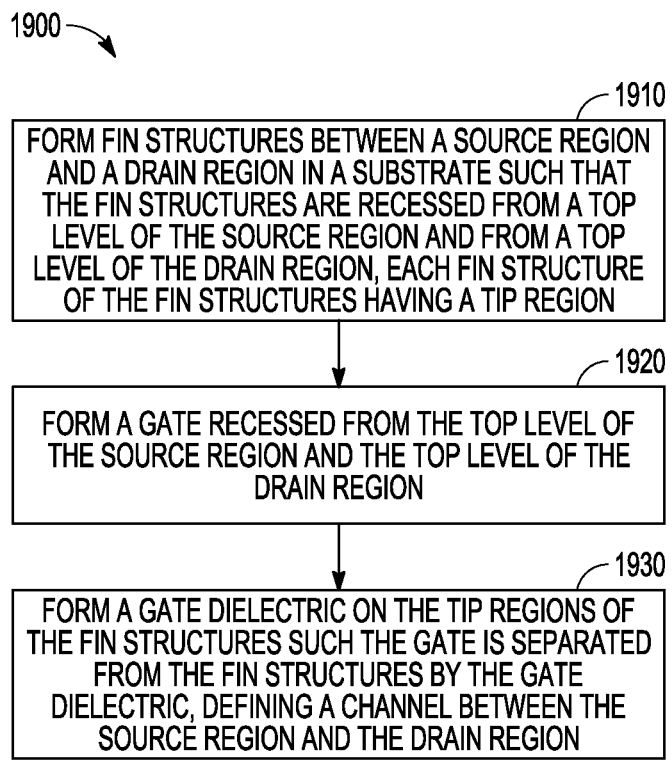
FIG. 19 is a flow diagram of features of an embodiment of an example method of forming a transistor having a recessed channel, according to various embodiments.

FIG. 19 is a flow diagram of features of an embodiment of an example method of forming a transistor having a recessed channel. At 1910, fin structures are formed between a source region and a drain region in a substrate such that the fin structures are recessed from a top level of the source region and from a top level of the drain region. Each fin structure of the fin structures has a tip region. Various formats can be implemented for the shape of the tip region.

At 1920, a gate is formed recessed from the top level of the source region and the top level of the drain region. At 1930, a gate dielectric is formed on the tip regions of the fin structures such that the gate is separated from the fin structures by the gate dielectric. The gate dielectric on the tip regions can define a channel between the source region and the drain region.

Variations of method 1900 or methods similar to method 1900 can include a number of different embodiments that can be combined depending on the application of such methods and/or the architecture of devices for which such methods are implemented. Such methods can include forming the fin structures in a periphery to a memory array of a memory device. Forming the fin structures can include forming the fin structures while forming access lines for memory cells of the memory array. Forming the gate to the fin structures can include forming the gate separately from forming gate structures for the memory cells of the memory array. In some embodiments, the fin structures can be formed having a depth or shape different from forming access lines for memory cells of the memory array.

Variations of method 1900 or methods similar to method 1900 can include forming the gate as a metal gate and forming the gate dielectric with dielectric material having a dielectric constant greater than 3.9. The dielectric material can be formed on silicon oxide. Variations of method 1900 or methods similar to method 1900 can include forming the gate as a n+ polysilicon or p+ polysilicon gate.

Variations of method 1900 or methods similar to method 1900 can include forming a trench to expose the tip regions of the fin structures to form the gate dielectric on the tip regions of the fin structures. After forming the trench, a dielectric material can be deposited by atomic layer deposition on the exposed tip regions. The thickness of the dielectric material can be adjusted to form the gate dielectric. The adjustment can include etching the dielectric material. Material for the gate can be formed on the gate dielectric and portions of the material for the gate can be removed such that a top of the gate is at a selected recessed level.

In various embodiments, a transistor arranged as a FinFET transistor has a structure including a recessed channel. A source region and a drain region are located in a substrate with one or more fin structures between the source region and the drain region. The one or more fin structures can be recessed from a top level of the source region and from a top level of the drain region, where each fin of the one or more fin structures is structured having a tip region. A gate can be recessed from the top level of the source region and the top level of the drain region. The gate can be separated from the tip regions of the one or more fin structures by a gate dielectric defining a channel between the source region and the drain region.

Variations of such a transistor and its features, as taught herein, can include a number of different embodiments and features that can be combined depending on the application of such transistors, the format of such transistors, and/or the architecture in which such transistors are implemented. Features of such transistors can include a top of the gate being at a level within a lower portion of the source region and the drain region. A junction of the source region can extend to a level under a top of the gate. Alternatively, a junction of the source region can extend to a level above a top of the gate.

Variations of such a transistor and its features, as taught herein, can include material of the gate including one or more of titanium nitride, tantalum nitride, tungsten, molybdenum, ruthenium, polysilicon, or a combination thereof. The gate dielectric on which the gate is located can include a high-k dielectric having a dielectric constant greater than 3.9. The high-k dielectric can be located on a silicon oxide region located on the tip regions of the one or more fins.

In various embodiments, a memory device can include an array of memory cells and circuitry for controlling operation of the array, where the circuitry is structured in a periphery to the array. The circuitry can include a transistor having a recessed channel. The transistor having a recessed channel can be structured as a FinFET transistor. The transistor can include a source region and a drain region located in a substrate, where fin structures are structured between the source region and the drain region. The fin structures can be recessed from a top level of the source region and from a top level of the drain region, where each fin structure has a tip region. A gate of the transistor can be recessed from the top level of the source region and from the top level of the drain region, where the gate is separated from the tip regions of the fin structures by a gate dielectric. The gate dielectric on the tip regions of the fin structures define a channel between the source region and the drain region.

Variations of such a memory device and its features, as taught herein, can include a number of different embodiments and features that can be combined depending on the application of such memory devices, the format of such memory devices, and/or the architecture in which such memory devices are implemented. Features of such memory devices can include a top of the gate being at a level within a lower portion of the source region and the drain region. A junction of the source region can extend to a level under a top of the gate. Alternatively, a junction of the source region can extend to a level above a top of the gate.

Variations of such a transistor and its features, as taught herein, can include material of the gate having a same composition as material of access lines to the memory cells of the array. The gate can include one or more of titanium nitride, tantalum nitride, tungsten, molybdenum, ruthenium, polysilicon, or a combination thereof. Other materials can be used. Material of an interconnection metal to the gate can have the same composition as material of digit lines in the array.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc. Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc. As used herein, "processor device" means any type of computational circuit such as, but not limited to, a microprocessor, a microcontroller, a graphics processor, a digital signal processor (DSP), or any other type of processor or processing circuit, including a group of processors or multi-core devices.

Figure 20:
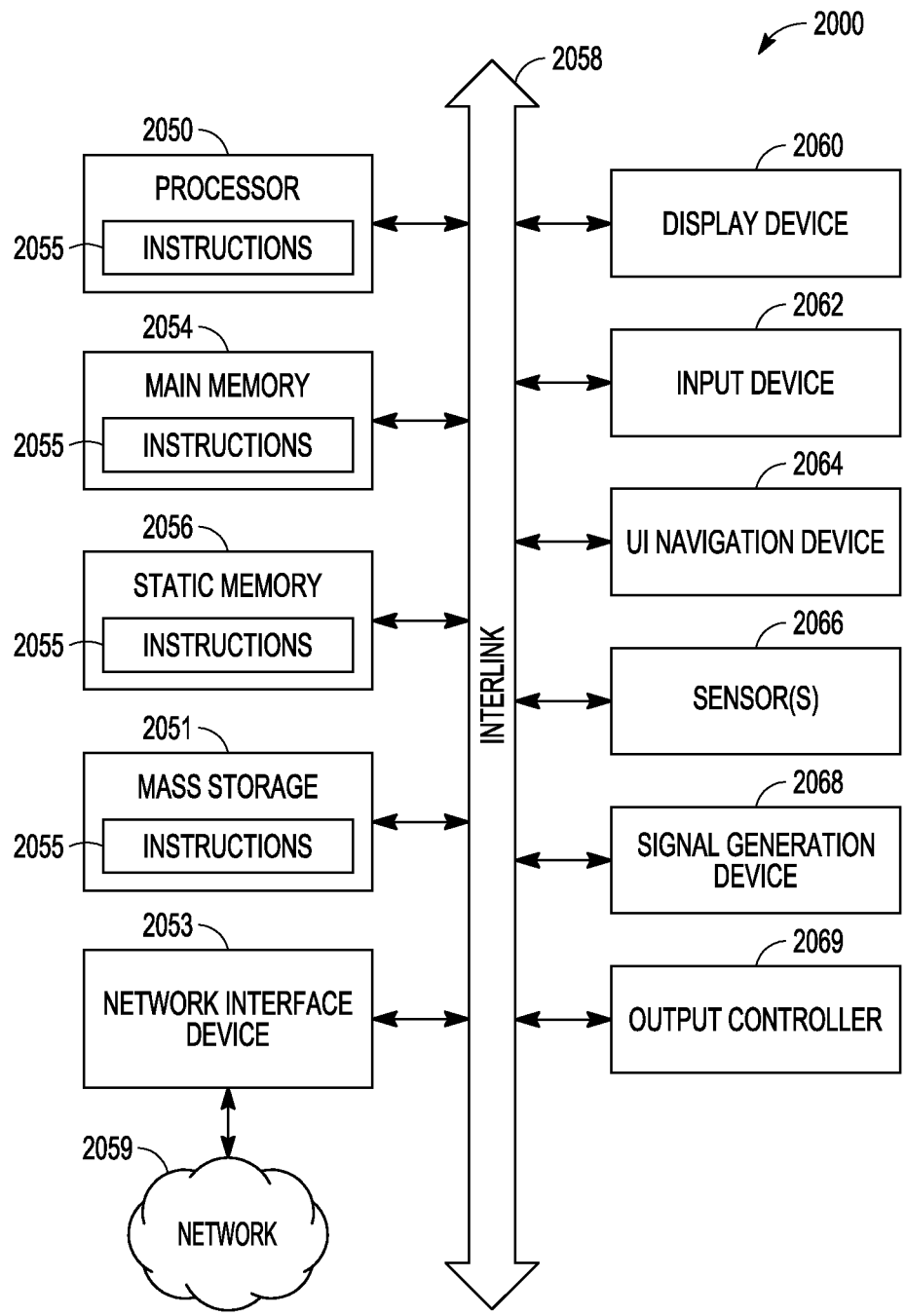
FIG. 20 is a block diagram illustrating an example of a machine that be implemented with devices having one or more recessed channel FinFETs, according to various embodiments.

FIG. 20 illustrates a block diagram of an example machine 2000 having one or more embodiments of recessed channel FinFETs discussed herein. In alternative embodiments, machine 2000 can operate as a standalone device or can be connected (e.g., networked) to other machines. In a networked deployment, machine 2000 can operate in the capacity of a server machine, a client machine, or both in server-client network environments. In an example, machine 2000 can act as a peer machine in peer-to-peer (P2P) (or other distributed) network environment. Machine 2000 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry.

The machine 2000 can include a hardware processor 2050 (e.g., a CPU, a GPU, a hardware processor core, or any combination thereof), a main memory 2054, and a static memory 2056, some or all of which can communicate with each other via an interlink 2058 (e.g., bus). Machine 2000 can further include a display device 2060, an input device 2062, which can be an alphanumeric input device (e.g., a keyboard), and a user interface (UI) navigation device 2064 (e.g., a mouse). In an example, display device 2060, input device 2062, and UI navigation device 2064 can be a touch screen display. Machine 2000 can additionally include a mass storage device (e.g., drive unit) 2051, a network interface device 2053, a signal generation device 2068, and one or more sensors 2066, such as a global positioning system (GPS) sensor, compass, accelerometer, or other sensor. Machine 2000 can include an output controller 2069, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Machine 2000 can include one or more machine-readable media on which is stored one or more sets of data structures or instructions 2055 (e.g., software, microcode, or other type of instructions) embodying or utilized by machine 2000 to perform any one or more of the techniques or functions for which machine 2000 is designed. The instructions 2055 can reside, completely or at least partially, within main memory 2054, within static memory 2056, or within hardware processor 2050 during execution thereof by machine 2000. In an example, one or any combination of hardware processor 2050, main memory 2054, static memory 2056, or mass storage device 2051 can constitute the machine-readable media on which is stored one or more sets of data structures or instructions.

While an example machine-readable medium is illustrated as a single medium, the term "machine-readable medium" can include a single medium or multiple media (e.g., a centralized or distributed database, or associated caches and servers) configured to store instructions 2055 or data. The term "machine-readable medium" can include any medium that is capable of storing instructions for execution by machine 2000 and that cause machine 2000 to perform any one or more of the techniques to which machine 2000 is designed, or that is capable of storing data structures used by or associated with such instructions. Non-limiting machine-readable medium examples can include solid-state memories, optical media, and magnetic media. Specific examples of non-transitory machine-readable media can include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

Instructions 2055 (e.g., software, programs, an operating system (OS), etc.) or other data stored on mass storage device 2051 can be accessed by main memory 2054 for use by hardware processor 2050. Main memory 2054 (e.g., DRAM) is typically fast, but volatile, and thus a different type of storage than mass storage device 2051 (e.g., an SSD), which is suitable for long-term storage, including while in an "off" condition. Instructions 2055 or data in use by a user or machine 2000 are typically loaded in main memory 2054 for use by hardware processor 2050. When main memory 2054 is full, virtual space from mass storage device 2051 can be allocated to supplement main memory 2054; however, because mass storage device 2051 is typically slower than main memory 2054, and write speeds are typically at least twice as slow as read speeds, use of virtual memory can greatly reduce user experience due to storage device latency (in contrast to main memory 2054, e.g., DRAM). Further, use of mass storage device 2051 for virtual memory can greatly reduce the usable lifespan of mass storage device 2051.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, embedded MMC (eMMC™) devices are attached to a circuit board and considered a component of the host device, with read speeds that rival Serial Advanced Technology Attachment (SATA)-based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

Instructions 2055 can further be transmitted or received over a network 2059 using a transmission medium via signal generation device 2068 or network interface device 2053 utilizing any one of a number of transfer protocols (e.g., frame relay, Internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, signal generation device 2068 or network interface device 2053 can include one or more physical jacks (e.g., Ethernet, coaxial, or phone jacks) or one or more antennas to connect to network 2059. In an example, signal generation device 2068 or network interface device 2053 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by machine 2000 or data to or from machine 2000, and can include instrumentalities to propagate digital or analog communications signals to facilitate communication of such instructions, which instructions may be implemented by software or data.

The following are example embodiments of devices and methods, in accordance with the teachings herein.

An example transistor 1 can comprise: a source region located in a substrate; a drain region located in the substrate; one or more fin structures between the source region and the drain region, the one or more fin structures recessed from a top level of the source region and from a top level of the drain region, each fin structure of the one or more fin structures having a tip region; and a gate recessed from the top level of the source region and the top level of the drain region, the gate separated from the tip region of the one or more fin structures by a gate dielectric defining a channel between the source region and the drain region.

An example transistor 2 can include features of example transistor 1 and can include a top of the gate being at a level within a lower portion of the source region and the drain region.

An example transistor 3 can include features of any features of the preceding example transistors and can include a junction of the source region extending to a level under a top of the gate.

An example transistor 4 can include features of example transistors 1 or 2 and can include a junction of the source region extending to a level above a top of the gate.

An example transistor 5 can include features of example transistor 4 and any of the preceding example transistors and can include the gate including one or more of titanium nitride, tantalum nitride, tungsten, molybdenum, ruthenium, polysilicon, or a combination thereof.

An example transistor 6 can include features of any of the preceding example transistors and can include the gate dielectric including a dielectric having a dielectric constant greater than 3.9.

In an example transistor 7, any of the transistors of example transistors 1 to 6 may include transistors incorporated into an electronic memory apparatus further comprising a host processor and a communication bus extending between the host processor and the transistor.

In an example transistor 8, any of the transistors of example transistors 1 to 8 may be modified to include any structure presented in another of example transistor 1 to 8.

In an example transistor 9, any apparatus associated with the transistors of example transistors 1 to 8 may further include a machine-readable storage device configured to store instructions as a physical state, wherein the instructions may be used to perform one or more operations of the apparatus.

In an example transistor 10, any of the transistors of example transistors 1 to 9 may be operated in accordance with any of the below example methods 1 to 10.

An example memory device 1 can comprise an array of memory cells; and circuitry for controlling operation of the array, the circuitry structured in a periphery to the array, the circuitry including a transistor having: a source region located in a substrate; a drain region located in the substrate; fin structures between the source region and the drain region, the fin structures recessed from a top level of the source region and from a top level of the drain region, each fin structure of the fin structures having a tip region; and a gate recessed from the top level of the source region and from the top level of the drain region, the gate separated from the tip regions of the fin structures by a gate dielectric defining a channel between the source region and the drain region.

An example memory device 2 can include features of example memory device 1 and can include a top of the gate being at a level within a lower portion of the source region and the drain region.

An example memory device 3 can include features of any features of the preceding example memory devices and can include material of the gate having a same composition as material of access lines to the memory cells of the array.

An example memory device 4 can include features of example memory device 3 or any of the preceding example memory devices and can include the gate including one or more of titanium nitride, tantalum nitride, tungsten, molybdenum, ruthenium, polysilicon, or a combination thereof.

An example memory device 5 can include features of any features of the preceding example memory devices and can include material of an interconnection metal to the gate having a same composition as material of digit lines in the array.

In an example memory device 6, any of the memory devices of example memory devices 1 to 5 may include memory devices incorporated into an electronic memory apparatus further comprising a host processor and a communication bus extending between the host processor and the memory device.

In an example memory device 7, any of the memory devices of example memory devices 1 to 6 may be modified to include any structure presented in another of example memory device 1 to 6.

In an example memory device 8, any apparatus associated with the memory devices of example memory devices 1 to 7 may further include a machine-readable storage device configured to store instructions as a physical state, wherein the instructions may be used to perform one or more operations of the apparatus.

In an example memory device 9, any of the memory devices of example memory devices 1 to 8 may be formed in accordance with any of the methods of the below example methods 1 to 10.

An example method 1 can comprise forming fin structures between a source region and a drain region in a substrate such that the fin structures are recessed from a top level of the source region and from a top level of the drain region, each fin structure of the fin structures having a tip region; forming a gate recessed from the top level of the source region and the top level of the drain region; and forming a gate dielectric on the tip regions of the fin structures such that the gate is separated from the fin structures by the gate dielectric, defining a channel between the source region and the drain region.

An example method 2 can include features of example method 1 and can include forming the fin structures to include forming the fin structures in a periphery to a memory array of a memory device.

An example method 3 can include features of example method 2 and any of the preceding example methods and can include forming the fin structures to include forming the fin structures while forming access lines for memory cells of the memory array.

An example method 4 can include features of example method 3 and any of the preceding example methods and can include forming the gate to include forming the gate separately from forming gate structures for the memory cells of the memory array.

An example method 5 can include features of example method 2 and any of the preceding example methods and can include forming the fin structures having a depth or shape different from forming access lines for memory cells of the memory array.

An example method 6 can include features of example method 2 and any of the preceding example methods and can include forming the gate as a metal gate; and forming the gate dielectric with dielectric material having a dielectric constant greater than 3.9.

An example method 7 can include features of example method 2 and any of the preceding example methods and can include forming the gate to include forming n+ polysilicon or p+ polysilicon.

An example method 8 can include features of example method 7 and any of the preceding example methods and can include forming the gate dielectric on the tip regions of the fin structures to include: forming a trench to expose the tip regions of the fin structures; depositing dielectric material by atomic layer deposition on the exposed tip regions; and adjusting a thickness of the dielectric material to form the gate dielectric.

An example method 9 can include features of example method 8 and any of the preceding example methods and can include forming material for the gate on the gate dielectric and removing portions of the material for the gate such that a top of the gate is at a selected recessed level.

In an example method 10, any of the example methods 1 to 9 may be performed in forming an electronic memory apparatus further comprising a host processor and a communication bus extending between the host processor and the memory device.

In an example method 11, any of the example methods 1 to 10 may be modified to include operations set forth in any other of example methods 1 to 10.

In an example method 12, any of the example methods 1 to 11 may be implemented at least in part through use of instructions stored as a physical state in one or more machine-readable storage devices.

An example method 13 can include features of any of the preceding example methods 1 to 12 and can include performing functions associated with any features of example memory devices 1 to 9 and example transistors 1 to 10.

An example machine-readable storage device 1 storing instructions, that when executed by one or more processors, cause a machine to perform operations, can comprise instructions to perform functions associated with any features of example memory devices 1 to 10 and example transistors 1 to 12 or perform methods associated with any features of example methods 1 to 13.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A transistor comprising:
    a source region located in a substrate;
    a drain region located in the substrate;
    one or more fin structures between the source region and the drain region, the one or more fin structures recessed from a top level of the source region and from a top level of the drain region, each fin structure of the one or more fin structures having a tip region; and
    a gate recessed from the top level of the source region and the top level of the drain region, the gate separated from the tip region of the one or more fin structures by a gate dielectric defining a channel between the source region and the drain region.

2. The transistor of claim 1, wherein a top of the gate is at a level within a lower portion of the source region and the drain region.

3. The transistor of claim 1, wherein a junction of the source region extends to a level under a top of the gate.

4. The transistor of claim 1, wherein a junction of the source region extends to a level above a top of the gate.

5. The transistor of claim 1, wherein the gate includes one or more of titanium nitride, tantalum nitride, tungsten, molybdenum, ruthenium, polysilicon, or a combination thereof.

6. The transistor of claim 1, wherein the gate dielectric includes a dielectric having a dielectric constant greater than 3.9.

7. A memory device comprising:
    an array of memory cells; and
    circuitry for controlling operation of the array, the circuitry structured in a periphery to the array, the circuitry including a transistor having:
        a source region located in a substrate;
        a drain region located in the substrate;
        fin structures between the source region and the drain region, the fin structures recessed from a top level of the source region and from a top level of the drain region, each fin structure of the fin structures having a tip region; and
        a gate recessed from the top level of the source region and from the top level of the drain region, the gate separated from the tip regions of the fin structures by a gate dielectric defining a channel between the source region and the drain region.

8. The memory device of claim 7, wherein a top of the gate is at a level within a lower portion of the source region and the drain region.

9. The memory device of claim 7, wherein material of the gate has a same composition as material of access lines to the memory cells of the array.

10. The memory device of claim 9, wherein the gate includes one or more of titanium nitride, tantalum nitride, tungsten, molybdenum, ruthenium, polysilicon, or a combination thereof.

11. The memory device of claim 7, wherein material of an interconnection metal to the gate has a same composition as material of digit lines in the array.

12. A method comprising:
    forming fin structures between a source region and a drain region in a substrate such that the fin structures are recessed from a top level of the source region and from a top level of the drain region, each fin structure of the fin structures having a tip region;
    forming a gate recessed from the top level of the source region and the top level of the drain region; and
    forming a gate dielectric on the tip regions of the fin structures such that the gate is separated from the fin structures by the gate dielectric, defining a channel between the source region and the drain region.

13. The method of claim 12, wherein forming the fin structures includes forming the fin structures in a periphery to a memory array of a memory device.

14. The method of claim 13, wherein forming the fin structures includes forming the fin structures while forming access lines for memory cells of the memory array.

15. The method of claim 14, wherein forming the gate includes forming the gate separately from forming gate structures for the memory cells of the memory array.

16. The method of claim 13, wherein the method includes forming the fin structures having a depth or shape different from forming access lines for memory cells of the memory array.

17. The method of claim 13, wherein the method includes:
    forming the gate as a metal gate; and
    forming the gate dielectric with dielectric material having a dielectric constant greater than 3.9.

18. The method of claim 13, wherein forming the gate includes forming n+ polysilicon or p+ polysilicon.

19. The method of claim 13, wherein forming the gate dielectric on the tip regions of the fin structures includes:
    forming a trench to expose the tip regions of the fin structures;
    depositing dielectric material by atomic layer deposition on the exposed tip regions; and
    adjusting a thickness of the dielectric material to form the gate dielectric.

20. The method of claim 19, wherein the method includes forming material for the gate on the gate dielectric and removing portions of the material for the gate such that a top of the gate is at a selected recessed level.

\* \* \* \* \*